(12) United States Patent
Nishihara

(10) Patent No.: US 10,341,589 B2
(45) Date of Patent: Jul. 2, 2019

(54) IMAGING DEVICE AND CAMERA SYSTEM INCLUDING SENSE CIRCUITS TO MAKE BINARY DECISION

(71) Applicant: Sony Corporation, Tokyo (JP)

(72) Inventor: Toshiyuki Nishihara, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 16/123,770

(22) Filed: Sep. 6, 2018

(65) Prior Publication Data

US 2019/0020833 A1    Jan. 17, 2019

Related U.S. Application Data

(63) Continuation of application No. 15/713,271, filed on Sep. 22, 2017, now Pat. No. 10,075,660, which is a (Continued)

(30) Foreign Application Priority Data

Aug. 28, 2009 (JP) .................. 2009-197986
Apr. 13, 2010 (JP) .................. 2010-092076

(51) Int. Cl.
*H04N 3/14*        (2006.01)
*H04N 5/335*       (2011.01)
(Continued)

(52) U.S. Cl.
CPC ............. *H04N 5/359* (2013.01); *G01J 1/44* (2013.01); *H01L 27/1469* (2013.01);
(Continued)

(58) Field of Classification Search
CPC ........ H04N 3/155; H04N 5/335; H04N 5/378; H04N 5/357; H04N 5/359; H04N 5/361;
(Continued)

(56) References Cited

U.S. PATENT DOCUMENTS 6,809,769 B1    10/2004 Yang
6,977,685 B1    12/2005 Acosta-Serafini et al.
(Continued)

FOREIGN PATENT DOCUMENTS

CN       1717016 A     1/2006
CN     101083725 A    12/2007
(Continued)

OTHER PUBLICATIONS

Extended European Search Report dated Nov. 2, 2010, in Patent Application No. 10173708.8.
(Continued)

*Primary Examiner* — Kelly L Jerabek
(74) *Attorney, Agent, or Firm* — Michael Best & Friedrich LLP

(57) ABSTRACT

An imaging device includes: a pixel array section having an array of pixels, each of which has a photoelectric converting device and outputs an electric signal according to an input photon; a sense circuit section having a plurality of sensor circuits each of which makes binary decision on whether there is a photon input to a pixel in a predetermined period upon reception of the electric signal therefrom; and a decision result IC section which integrates decision results from the sense circuits, pixel by pixel or for each group of pixels, multiple times to generate imaged data with a gradation, the decision result IC section including a count circuit which performs a count process to integrate the decision results from the sense circuits, and a memory for storing a counting result for each pixel from the count circuit, the sense circuits sharing the count circuit for integrating the decision results.

20 Claims, 17 Drawing Sheets

Related U.S. Application Data continuation of application No. 15/438,320, filed on Feb. 21, 2017, now Pat. No. 9,794,501, which is a continuation of application No. 15/164,622, filed on May 25, 2016, now abandoned, which is a continuation of application No. 14/716,453, filed on May 19, 2015, now Pat. No. 9,374,541, which is a continuation of application No. 14/470,516, filed on Aug. 27, 2014, now Pat. No. 9,055,247, which is a continuation of application No. 13/930,827, filed on Jun. 28, 2013, now Pat. No. 8,842,206, which is a continuation of application No. 12/846,285, filed on Jul. 29, 2010, now Pat. No. 8,488,034.

(51) Int. Cl.

| | | |
|---|---|---|
| *H04N 5/359* | (2011.01) | |
| *G01J 1/44* | (2006.01) | |
| *H01L 27/146* | (2006.01) | |
| *H04N 5/353* | (2011.01) | |
| *H04N 5/357* | (2011.01) | |
| *H04N 5/361* | (2011.01) | |
| *H04N 5/365* | (2011.01) | |
| *H04N 5/3745* | (2011.01) | |
| *H04N 5/374* | (2011.01) | |
| *H04N 5/378* | (2011.01) | |
| *H04N 5/369* | (2011.01) | |
| *H01L 27/148* | (2006.01) | |

(52) U.S. Cl.
CPC .. *H01L 27/14612* (2013.01); *H01L 27/14621* (2013.01); *H01L 27/14627* (2013.01); *H01L 27/14634* (2013.01); *H01L 27/14636* (2013.01); *H01L 27/14643* (2013.01); *H01L 27/14645* (2013.01); *H04N 5/3355* (2013.01); *H04N 5/357* (2013.01); *H04N 5/3535* (2013.01); *H04N 5/3537* (2013.01); *H04N 5/361* (2013.01); *H04N 5/365* (2013.01); *H04N 5/374* (2013.01); *H04N 5/378* (2013.01); *H04N 5/379* (2018.08); *H04N 5/37452* (2013.01); *H04N 5/37455* (2013.01)

(58) Field of Classification Search
CPC ... H04N 5/365; H04N 5/3537; H04N 5/37452
USPC .......................... 348/294, 297, 308, 362–368
See application file for complete search history.

(56) References Cited

U.S. PATENT DOCUMENTS

| | | |
|---|---|---|
| 8,488,034 B2 | 7/2013 | Nishihara |
| 8,842,206 B2 | 9/2014 | Nishihara |
| 2002/0196170 A1 | 12/2002 | McIlrath |
| 2003/0173522 A1 | 9/2003 | Spartiotis |
| 2006/0023109 A1 | 2/2006 | Mabuchi et al. |
| 2006/0146233 A1 | 7/2006 | Park |

FOREIGN PATENT DOCUMENTS

| | | |
|---|---|---|
| CN | 101452942 A | 6/2009 |
| JP | 7-67043 | 3/1995 |
| JP | 2002-44527 | 2/2002 |
| JP | 2004-193675 | 7/2004 |
| JP | 2006-49361 | 2/2006 |
| JP | 2006-506829 A | 2/2006 |
| JP | 2006-191081 | 7/2006 |
| JP | 2007-234725 | 9/2007 |

OTHER PUBLICATIONS

Office Action dated Jun. 5, 2012 in European Patent Application No. 10 173 708.8.
Abbas El Gamal, et al., "CMOS Image Sensors", IEEE Circuits and Devices Magazine, vol. 21, No. 3, XP011133522, May 1, 2005, pp. 6-20.
Office Action dated Oct. 1, 2013 in Japanese Patent Application No. 2010-092076.
Extended European Search Report dated Jun. 2, 2014 to European application No. 14155954.2-1902.
Office Action dated Jul. 13, 2015 in corresponding European Application No. 14 155 954.2.
Korean Office Action with English translation dated Mar. 8, 2016 in Patent Application No. 10-2010-0083365 (7 pages).
Combined Chinese Office Action and Search Report dated Aug. 15, 2016 in Patent Application No. 201310329116.5 (with English translation).

Related Art

Related Art

EXP1: FIRST EXPOSURE
EXP2: SECOND EXPOSURE

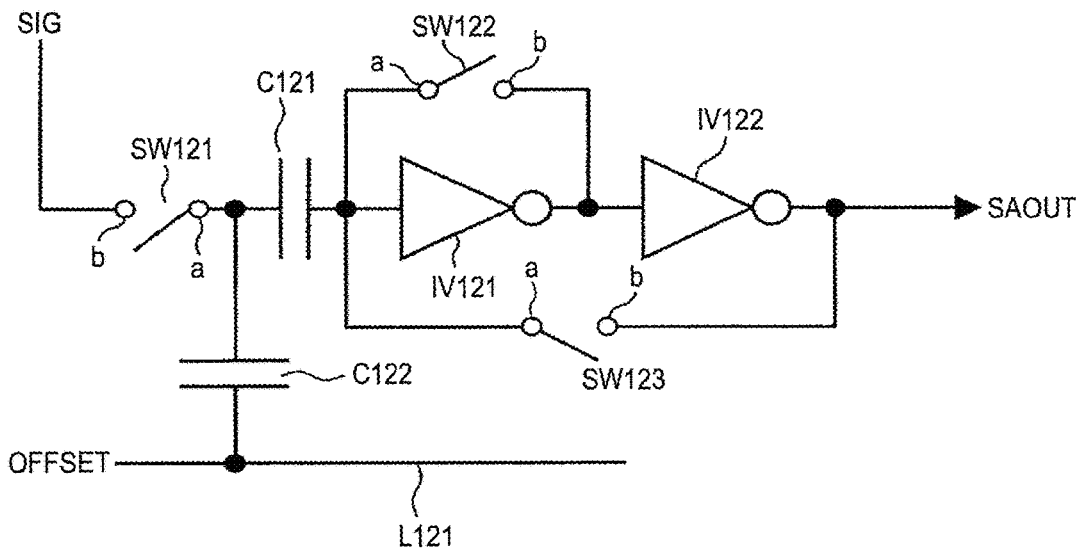
FIG.11
121B
FIG.12A  RESET (118)
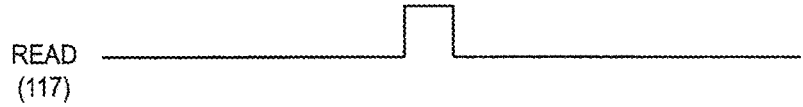
FIG.12B  READ (117)
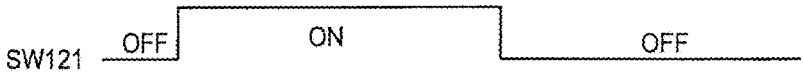
FIG.12C  SW121   OFF  ON  OFF
FIG.12D  SW122   OFF  ON  OFF
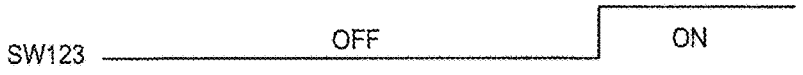
FIG.12E  SW123   OFF  ON
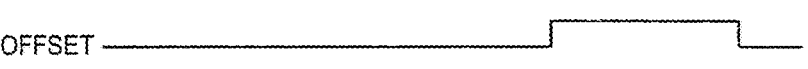
FIG.12F  OFFSET

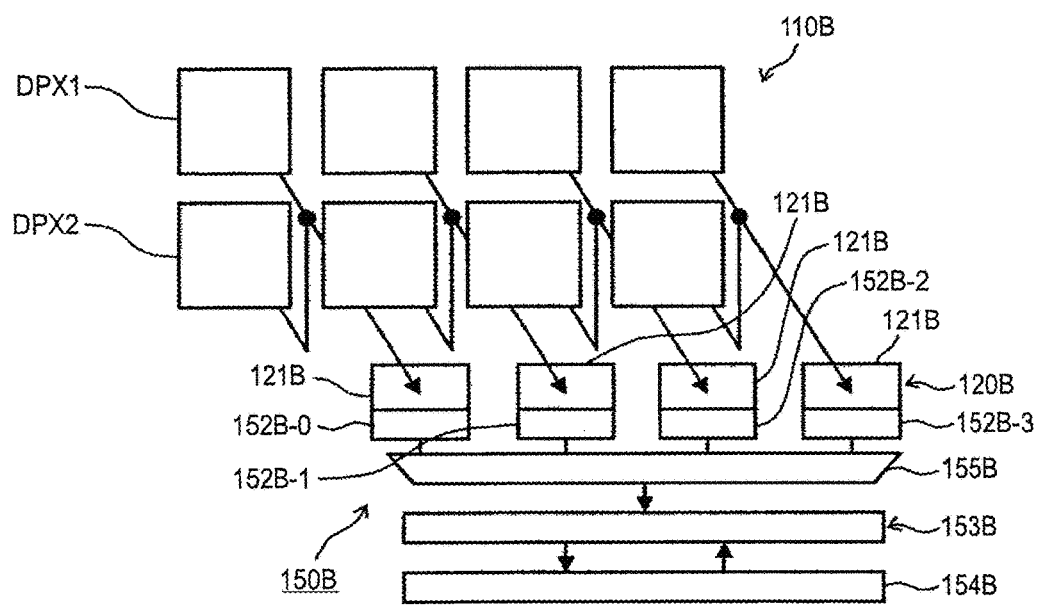
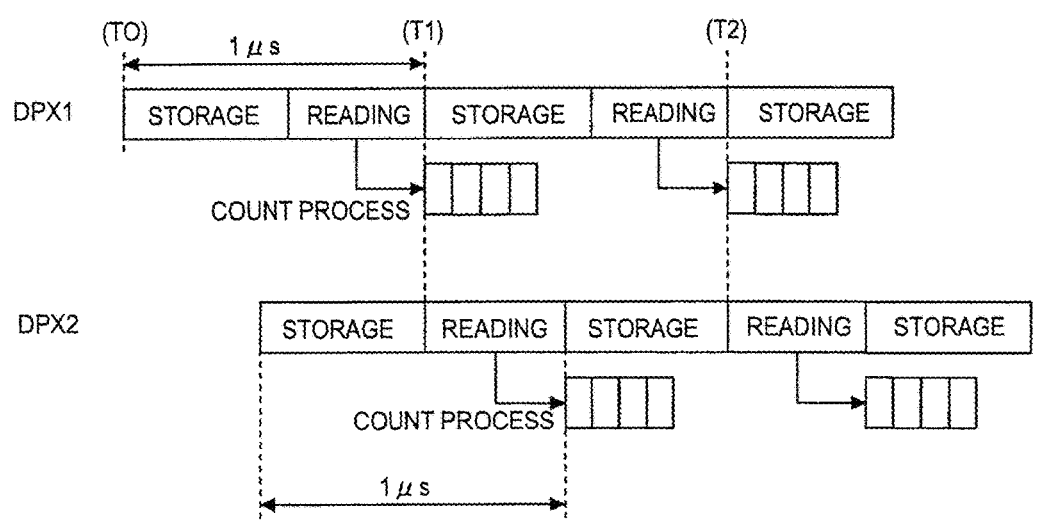

DATA PROCESS FLOW AT LOW ILLUMINANCE

CONCEPTUAL DIAGRAM OF CYCLE SWITCHING

DOUBLE CYCLE PERIOD (COUNT NUMBER TO x1/2)

TRIPLE CYCLE PERIOD (COUNT NUMBER TO x1/3)

QUADRUPLE CYCLE PERIOD (COUNT NUMBER TO x1/4)

EXAMPLE OF CIRCULATION OF TWO TYPES OF CYCLES

IMAGING DEVICE AND CAMERA SYSTEM INCLUDING SENSE CIRCUITS TO MAKE BINARY DECISION

CROSS-REFERENCE TO RELATED APPLICATIONS

This application is a continuation of U.S. application Ser. No. 15/713,271, filed Sep. 22, 2017, which is a continuation of U.S. application Ser. No. 15/438,320, filed Feb. 21, 2017, which is a continuation of U.S. application Ser. No. 15/164, 622, filed May 25, 2016, which is a continuation of U.S. application Ser. No. 14/716,453, filed May 19, 2015, now U.S. Pat. No. 9,374,541, issued Jun. 21, 2016, which is continuation of U.S. application Ser. No. 14/470,516, filed Aug. 27, 2014, now U.S. Pat. No. 9,055,247, issued Jun. 9, 2015, which is a continuation of U.S. application Ser. No. 13/930,827, filed Jun. 28, 2013, now U.S. Pat. No. 8,842, 206, issued Sep. 23, 2014, which is a continuation of U.S. application Ser. No. 12/846,285, filed Jul. 29, 2010, now U.S. Pat. No. 8,488,034, issued Jul. 16, 2013, which claims the benefit of priority from Japanese Patent Application Nos. 2009-197986, filed Aug. 28, 2009 and 2010-092076, filed Apr. 13, 2010, the entire contents of each of which are incorporated herein by reference.

BACKGROUND OF THE INVENTION

1. Field of the Invention

The present invention relates to an imaging device like a CMOS image sensor, and a camera system.

2. Description of the Related Art

Recently, CMOS image sensors have widely been used in digital still cameras, camcorders, monitor cameras, etc., and the market for the CMOS image sensors has expanded.

Each pixel in a CMOS image sensor converts input light to electrons using a photodiode which is a photoelectric converting device, stores the electron for a given period, and then outputs a signal reflecting the amount of stored charges to an analog-digital (AD) converter incorporated in a chip. The AD converter digitizes the signal to be sent outside.

The CMOS image sensor has such imaging pixels laid out in a matrix form.

FIG. 1 is a diagram showing the typical chip configuration of a CMOS image sensor 10 which is a solid-state imaging device.

This CMOS image sensor 10 has a pixel array section 11, a row drive circuit 12, an AD converter 13, a switch 14, an output circuit 15, a row control line 16, a vertical signal line 17, and a transfer line 18.

The pixel array section 11 has a plurality of pixels PX laid out in a matrix form in the row direction and in the column direction. The vertical signal line 17 is shared by a plurality of pixels PX aligned in the row direction, and is connected to the AD converter 13 arranged in association with each column.

The row drive circuit 12 selects only one of a plurality of rows, and enables the row control line 16 to read stored charges from the pixels PX row by row.

The row control line 16 is formed by a single control line or a plurality of control lines to read stored charges from such pixels, or reset the pixels row by row.

Resetting herein means an operation of discharging stored charges from the pixels to set back the pixels to the state before exposure, and is executed as a shutter operation immediately after reading each row of pixels or at the time of initiating exposure.

At the time of reading stored charges, analog signals transferred to the AD converter 13 via the vertical signal line 17 are converted to digital signals, which are in turn sequentially transferred to the output circuit 15 via the switch 14 to be output to an image processing apparatus (not shown) located inside or outside the chip.

When reading one row of pixels is completed in the CMOS image sensor 10, a next row is selected, and similar charge reading, AD conversion, and signal outputting are repeated. The completion of the processes on all the rows completes the outputting of one frame of image data.

A hold circuit or a latch may be provided somewhere before the output stage to pipeline the charge reading, AD conversion, and signal outputting, but the CMOS image sensor is still unable to execute more than one row of image data.

The time needed to finish processing every row of data defines the upper limit of the frame rate of dynamic images.

JP-A-2002-44527 (Patent Document 1) and JP-A-2006-49361 (Patent Document 2) have proposed an image sensor which has a laminate of pixels and AD converters.

FIG. 2 is a conceptual diagram of a CMOS image sensor 10A which has a laminate of pixels and AD converters.

To help understand the concept, same reference numerals are given to the same components as shown in FIG. 1.

The CMOS image sensor 10A in FIG. 2 has pixels PX and AD converters 13 respectively arranged on different semiconductor substrates in an array. The two semiconductor substrates are laminated one on the other, with each pixel connected to the respective AD converter by an analog signal line 17.

The use of such an architecture can ensure reading charges from multiple rows of pixels at a time, and parallel execution of AD conversion row by row.

The data after conversion is temporarily transferred to a memory 19 to be transferred to an image processing apparatus (not shown) located inside or outside the chip.

The adoption of such a laminate structure can dramatically improve the imaging speed at least in the imaging chip, thereby ensuring ultrafast frame imaging.

Further, development of a high-precision wafer adhering technique has lately attracted considerable attention. For example, JP-A-2007-234725 (Patent Document 3) and JP-A-2006-191081 (Patent Document 4) describe a technique of adhering a back-irradiation type image sensor and a circuit-mounted substrate opposite to each other, and transfer signals therebetween via a metal pad.

This technique makes it possible to prepare a laminate structure as shown in FIG. 2 in the wafer-level fabrication, and connect pixels to AD converters without implementing bump connection for each chip.

Since this technique allows individual chips to be cut out after the wafer-level fabrication, it is suitable for microprocessing and is considerably inexpensive.

JP-A-7-67043 (Patent Document 5) has proposed a new scheme of counting photons in a time-divisional manner.

According to the counting scheme, binary decision on the presence/absence of a photon input to a photodiode in a given period is repeatedly performed multiple times, and the decision results are integrated to acquire two-dimensional imaged data.

That is, signals from the photodiode in the given period are sensed, and a counter connected to each pixel is counted up by 1, regardless of the number of input photons when the number of photons input in that period is equal to or greater than 1.

If the frequency of photon inputs is random along the time axis, the actual number of photons input and the count number are conform to the Poisson distribution, so that the numbers have a substantially linear relation when the incident frequency is low, and can be corrected in any case when the incident frequency is high.

Since the image sensor using such time-divisional photon counting treats data output from the pixels always as digital data, random noise or fixed nose originated from transmission and amplification of analog signals do not occur.

At this time, it is only the photo shot noise and dark current generated in the pixels that remain, and a very high S/N ratio can be acquired particularly in imaging with low illuminance.

SUMMARY OF THE INVENTION

The use of the structure in FIG. 2 can allow signals to be read out from the pixel array section fast in parallel and be subjected to AD conversion before being stored as data in the memory.

However, significant difficulties still remain in digitizing the data and making the best use of the imaged data stored in the memory 19.

First, when a vast amount of data acquired at the frame rate several ten times faster is transferred outside as it is, the transfer interface and the chip for the subsequent image processing become very expensive. If the frame rate is merely increased considerably over the sensing ability of eyes, application of the image sensor is limited.

Therefore, it is desirable to take some new measures to add useful effects including an improvement of the image quality, if possible, in the imaging chip and output data of a band width which does not differ much from that in the normal case by applying such ultrafast imaging.

However, Patent Document 2 hardly states data processing following memory storage.

In the literature cited in the description of the embodiment in Patent Document 1, the fast reading performance is applied to achievement of "Sigma-Delta" based AD conversion.

However, this scheme makes it difficult to compensate for a variation in characteristics of individual AD converters, and achievement of such AD conversion should not necessarily improve the image quality.

In general, the normal image sensor outputs an analog signal, photoelectrically converted by a pixel, and subjects the analog signal to AD conversion, so that various kinds of noise are mixed in the process of transmitting analog data and the process of converting the analog data to digital data.

Configuration of a normal image sensor to have a laminate structure needs analog signal connection between the substrates.

However, as compared with connection within the same substrate, the connection between substrates is accompanied by a larger variation in impedance, parasitic capacitance, etc., which may generate extra noise.

Patent Documents 5 and 6 have proposed imaging devices which use photon counting.

Such an imaging device receives outputs from pixels directly in the digital form, so that it is possible to completely eliminate random noise or fixed noise originated from analog signal processing which is inevitable in the normal image sensor. This leads to a potentially very high S/N ratio.

Since photon counting needs extremely fast reading, however, the imaging devices disclosed in those two patent documents have digital decision functions provided in the individual pixels, and provided on the same substrate where the light receiving devices are disposed.

For example, a counter is needed for each pixel in Patent Document 5.

In Patent Document 6 which has achieved miniaturization of pixels, the pixels individually need 1-bit memories which are disposed planarly along with the light receiving devices.

In addition, the circuit which is called "1-bit memory" needs to also have a signal decision function, and needs more complex control and more circuit elements than a simple latch.

This makes the number of apertures of pixels very small, so that sufficient sensitivity cannot be obtained. In addition, a counter, located outside the pixel array though, is provided for each pixel.

According to the technique proposed in Patent Document 5, the number of photons that can actually be sensed is defined by the total number of readout decisions in one frame period to form a single image in imaging using time-divisional photon counting.

When a 12-bit output is acquired in 4095 decisions on photon inputs, for example, the actual number of sensible photons is equal to or less than the former number, and the square root of that number becomes photo shot noise which occurs at random for each frame.

In case of imaging with low illuminance, the total number of photons input to a pixel in one frame period is, for example, 200 most of which is actually counted without any problem. Therefore, the S/N ratio of the photo shot noise becomes about the same as that of the analog sensor in the related art, which makes the time-divisional photon counting advantageous over the related art for it is free of analog transmission noise significantly larger than the photo shot noise.

In case of imaging with high illuminance, on the other hand, and analog sensor whose photodiode stores 10,000 electrons, for example, can count that quantity of electrons at a maximum.

At this time, the photo shot noise is 100 e-rms, and the S/N ratio becomes 100 times (40 dB) greater. The time-divisional photon counting cannot count about 1,600 electrons if a linear region is used in consideration of the precision.

At this time, the photo shot noise is 40 e-rms, and the S/N ratio obtained is 40 times (32 dB) greater.

In case of a full digital imager which uses time-divisional photon counting, therefore, the total number of counts needs to be increased in order to improve the S/N ratio of imaging with high illuminance.

However, the total number of counts is restricted by the time of reading data from the pixels at the time of making a decision on photon inputs.

While reading pixel data is the detection of a minute single photon signal, random noise of the sensing circuit increases as the reading becomes faster. Therefore, an increase in readout error ratio limits the data readout time.

Suppose that data reading needs 400 nanoseconds. Normally, the reading operation of an imager is destructive reading, so that a pixel in reading cannot store charges (charge storage being equivalent to exposure).

To secure the exposure time which is, for example, 90 percent of the frame period, therefore, the cycle time of decision which is the sum of the exposure time and the readout period needs to be 4 microseconds.

Provided that one frame period is 1/60 second, the then maximum number of counts in decision reaches as high as 4,166. This number is insufficient to secure a high S/N ratio at the time of high illuminance.

It is therefore desirable to provide an imaging device and a camera system which eliminate the need for handling analog signals to cancel out circuit noise originated from an AD converter and handling analog signals, without reducing the number of apertures of pixels, thereby improving the imaging performance at a low cost.

It is also desirable to provide an imaging device and a camera system which optimize the setting of exposure when time-divisional photon counting is used.

According to one embodiment of the invention, there is provided imaging device including a pixel array section having an array of pixels each of which has a photoelectric converting device and outputs an electric signal according to an input photon, a sense circuit section having a plurality of sensor circuits each of which makes binary decision on whether there is a photon input to a pixel in a predetermined period upon reception of the electric signal therefrom, and a decision result IC section which integrates decision results from the sense circuits, pixel by pixel or for each group of pixels, multiple times to generate imaged data with a gradation, the decision result IC section including a count circuit which performs a count process to integrate the decision results from the sense circuits, and a memory for storing a counting result for each pixel from the count circuit, the plurality of sense circuits sharing the count circuit for integrating the decision results.

According to another embodiment of the invention, there is provided a camera system having an imaging device, an optical system which forms an image of a subject onto the imaging device, and a signal processing circuit which processes an output image signal from the imaging device, the imaging device including a pixel array section having an array of pixels each of which has a photoelectric converting device and outputs an electric signal according to an input photon, a sense circuit section having a plurality of sensor circuits each of which makes binary decision on whether there is a photon input to a pixel in a predetermined period upon reception of the electric signal therefrom, and a decision result IC section which integrates decision results from the sense circuits, pixel by pixel or for each group of pixels, multiple times to generate imaged data with a gradation, the decision result IC section including a count circuit which performs a count process to integrate the decision results from the sense circuits, and a memory for storing a counting result for each pixel from the count circuit, the plurality of sense circuits sharing the count circuit for integrating the decision results.

The embodiments of the invention can eliminate handling of analog signals to cancel out circuit noise originated from an AD converter and handling analog signals, without reducing the number of apertures of pixels, thereby improving the imaging performance at a low cost.

It is also possible to optimize the setting of exposure when time-divisional photon counting is used.

BRIEF DESCRIPTION OF THE DRAWINGS

FIG. 11 is a circuit diagram showing one example of a sense circuit having a self-referring function;

FIGS. 12A to 12F present a timing chart for explaining an example of a reading operation using the sense circuit with the self-referring function in FIG. 11 referring to the pixel in FIG. 4 by way of example;

FIG. 16 is a diagram showing an example of the configuration of a CMOS image sensor (imaging device) according to a third embodiment of the invention;

FIG. 17 is a diagram illustrating the flow of an imaged data process at high illuminance in the circuit in FIG. 16;

DESCRIPTION OF THE PREFERRED EMBODIMENTS

Figure 1:
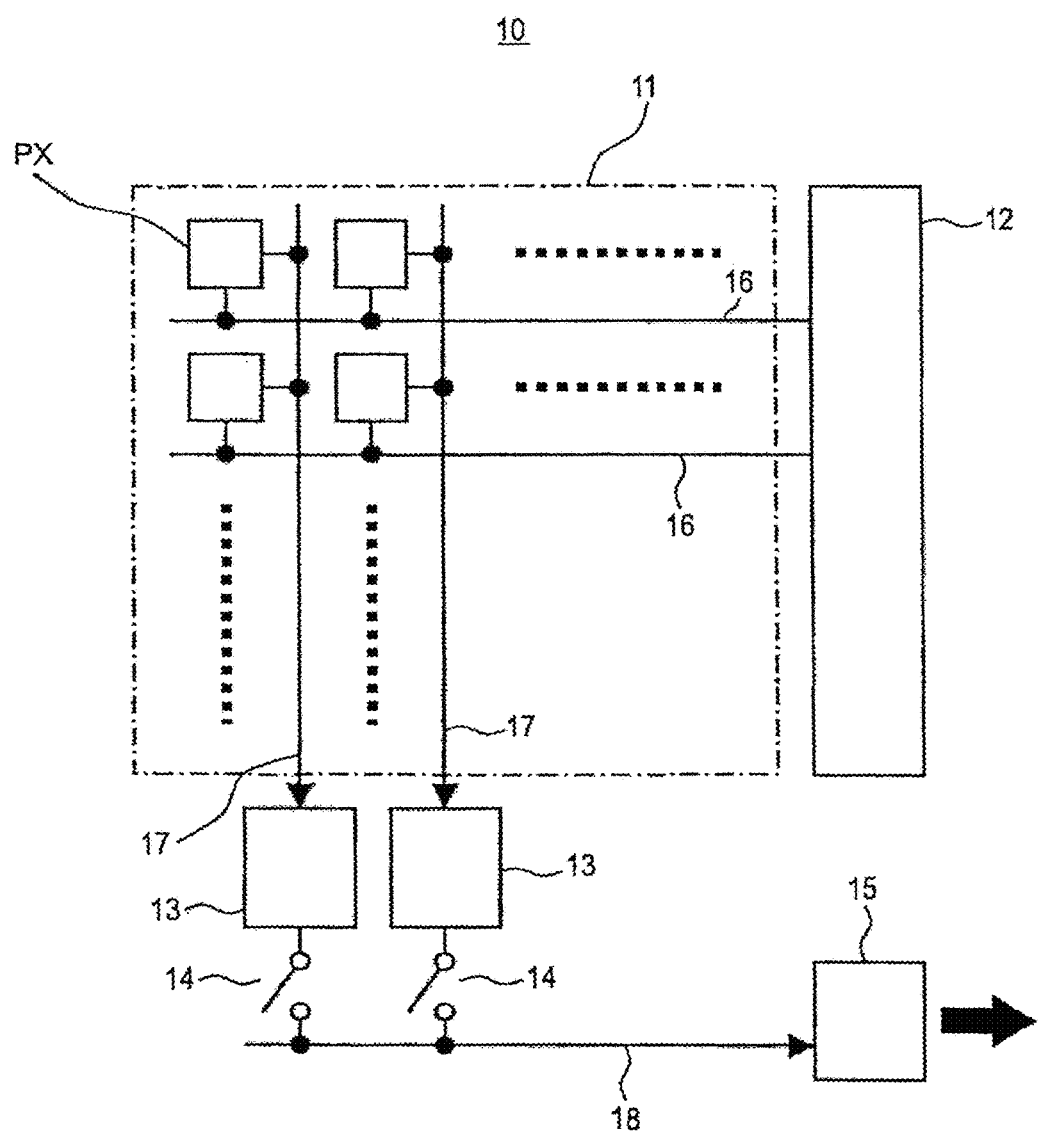
FIG. 1 is a diagram showing the typical chip configuration of a CMOS image sensor which is a solid-state imaging device.

Preferred embodiments of the present invention will be described below with reference to the accompanying drawings.

The description will be given in the following order.

1. Outline of the Features of Imaging Device According to Embodiment of the Invention 2. First Embodiment (First Configurational Example of Imaging Device)

3. Second Embodiment (Second Configurational Example of Imaging Apparatus)

4. Third Embodiment (Third Configurational Example of Imaging Device)

5. Fourth Embodiment (Camera System)

<1. Outline of the Features of Imaging Device According to Embodiment of the Invention>

From the viewpoint of fast parallel reading, an embodiment of the invention realizes the optimal configuration of an imaging device (CMOS image sensor) as a full digital image sensor using photon counting.

First, each pixel outputs an electric signal representing the presence/absence of a photon input within a specific period. A sense circuit receives the result of the presence/absence of a photon input multiple times in one frame period, and makes a binary decision on each result. The imaging device generates gradation data for each pixel through integration of the decision results.

Based on this basic configuration, the imaging device according to the mode has the following characteristic structures.

The first characteristic structure is the laminate of pixels and sense circuits using different semiconductor substrates. The pixels and the sense circuits are respectively formed in arrays, which are laminated to realize fast parallel reading without sacrificing the number of apertures.

The second characteristic structure is the hierarchical arrangement of a plurality of sense circuits and a count circuit for integrating decision results, so that the sense circuits share the count circuit. The sharing of the count circuit with a plurality of sense circuits can ensure flexible optimization of the circuit scale and the processing speed.

The third characteristic structure is the function of adjusting the exposure time by changing the reset timing. The exposure time is adjusted by changing the reset timing, not the read timing, thereby realizing flexible pipeline to the subsequent transfer process.

The fourth characteristic structure is the hierarchical arrangement of the pixels, the sense circuits, and the count circuit. The sharing of the sense circuit with a plurality of pixels, and cyclic access make it possible to cope with smaller pixels while securing the exposure time. Further, the sharing of the count circuit with a plurality of sense circuits can ensure flexible optimization of the circuit scale and the processing speed.

The fifth characteristic structure is the sensing using the self-referring function to enable the detection of one photon for a pixel. The reset level and the signal level are read from a pixel, and the two levels one of which is added with an offset are compared with each other to carryout a binary decision. This cancels out a pixel-by-pixel variation in reset level.

The mode which employs the above structures can provide the imaging device with the photon counting capability without sacrificing the number of apertures of pixels, and can completely eliminate random noise and fixed noise which are originated from analog signal processing and which would not be normally inevitable in image sensors. At this time, it is only the photo shot noise and dark current for each pixel that remain, thus achieving a very high S/N ratio, which ensure generation of clear gradation images.

Since the sense circuits or the like can be arranged under the pixels, and a complicated analog circuit is not needed, the chip is mostly occupied by the pixel array alone, making it possible to contribute to reduction of the chip cost.

Further, the dynamic range can be significantly expanded without changing the pixels by increasing the sampling number to form one frame or performing the sampling operation at different exposure times combined.

Even if the pixels and the sense circuits are laminated using different substrates, outputs from the pixels to the sense circuits need not have the accuracy of analog outputs, so that the impedance of the signal wiring and a variation in parasitic capacitance does not affect as noise.

Furthermore, digital reading using self-referring function considerably improves the decision accuracy.

The following elaborates a CMOS image sensor as an imaging device according to the mode which has the aforementioned features.

<2. First Embodiment>

Figure 3:
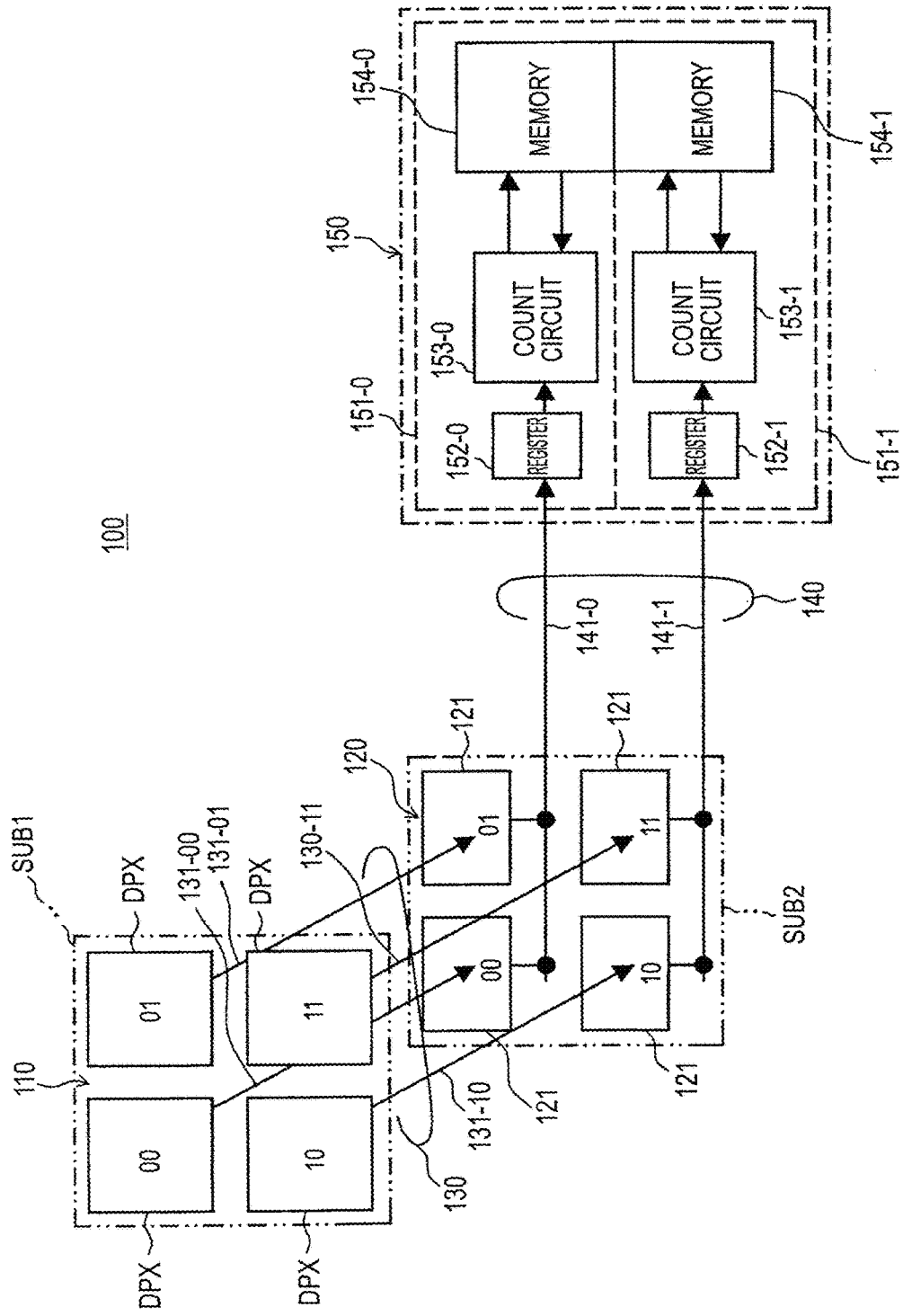
FIG. 3 is a diagram showing an example of the configuration of a CMOS image sensor (imaging device) according to a first embodiment of the present invention.

FIG. 3 is a diagram showing an example of the configuration of a CMOS image sensor (imaging device) 100 according to the first embodiment of the invention.

[Outline of General Configuration]

The CMOS image sensor 100 CMOS image sensor 100 has an pixel array section 110, a sense circuit section 120, a group of output signal lines 130, a group of transfer lines 140, and a decision result IC section 150.

The pixel array section 110 has a plurality of digital pixels DPX laid out in a matrix form in the row direction and in the column direction.

Each digital pixel DPX has a photoelectric converting device, and has a function of outputting an electric signal according to an input photon.

The pixel array section 110 is formed on, for example, a first semiconductor substrate SUB1.

The sense circuit section 120 is formed on a second semiconductor substrate SUB2 different from the first semiconductor substrate SUB1.

The sense circuit section 120 has a plurality of sense circuits 121 laid out, for example, in a matrix form in the row direction and in the column direction in one-to-one correspondence to the matrix of pixels DPX in the pixel array section 110.

Each sense circuit 121 has a function of making a binary decision on whether there is a photon input to the respective digital pixel DPX for a predetermined period upon reception of a signal therefrom.

The first semiconductor substrate SUB1 and the second semiconductor substrate SUB2 are laminated.

For example, the lamination is carried out in such a way that a plurality of pixels DPX formed on the first semiconductor substrate SUB1 face a plurality of sense circuits 121 formed on the second semiconductor substrate SUB2 in one to one. The opposing pixel DPX and sense circuit 121 are connected by each output signal line 131 in the output signal line group 130.

In the example in FIG. 3, the output of a pixel DPX-00 located at the 0th row and 0th column is connected to the input of a sense circuit 121-00 located at the 0th row and 0th column by an output signal line 131-00. The output of a pixel DPX-01 located at the 0th row and first column is connected to the input of a sense circuit 121-01 located at the 0th row and first column by an output signal line 131-01.

The output of a pixel DPX-10 located at the first row and 0th column is connected to the input of a sense circuit 121-10 located at the first row and 0th column by an output signal line 131-10. The output of a pixel DPX-11 located at the first row and first column is connected to the input of a sense circuit 121-11 located at the first row and first column by an output signal line 131-11.

The pixels and sense circuits located at the other rows and columns are likewise connected, though not illustrated.

The outputs of the sense circuits 121 in the sense circuit section 120 which are located at the same row are connected to a common transfer line 141.

In the example in FIG. 3, the outputs of the sense circuits 121-00, 121-01, . . . located at the 0th row are connected to a transfer line 141-0.

The outputs of the sense circuits 121-10, 121-11, . . . located at the first row are connected to a transfer line 141-1. A similar connection is made for the second and subsequent rows, through not illustrated.

The decision result IC section 150 has a function of integrating the decision results from the sense circuits 121 multiple times pixel by pixel to generate two-dimensional imaged data with gradation.

The decision result IC section 150 has decision result ICs 151-0, 151-1 . . . in association with the row arrangement of the sense circuits 121 in the sense circuit section 120.

In other words, a decision result IC 151-0 is connected to the transfer line 141-0 to which the sense circuits 121-00, 121-01, . . . located at the 0th row are connected.

A decision result IC 151-1 is connected to the transfer line 141-1 to which the sense circuits 121-10, 121-11, . . . located at the first row are connected.

The decision result IC 151-0 has a register 152-0 which holds a decision value transferred along the transfer line 141-0, a count circuit 153-0 which counts a value held in the register 152-0, and a memory 154-0 which stores the counting result from the count circuit 153-0.

The decision result IC 151-1 has a register 152-1 which holds a decision value transferred along the transfer line 141-1, a count circuit 153-1 which counts a value held in the register 152-1, and a memory 154-1 which stores the counting result from the count circuit 153-1.

According to the embodiment, the count circuit 153-0 of the decision result IC 151-0 is shared by a plurality of sense circuits 121-00, 121-01, . . . .

Likewise, the count circuit 153-1 of the decision result IC 151-1 is shared by a plurality of sense circuits 121-10, 121-11, . . . .

[Function of Digital Pixel]

As mentioned above, the digital pixel (which hereinafter may be simply called "pixel") DPX has the photoelectric converting device, and outputs an electric signal according to an input photon.

The CMOS image sensor 100 as an imaging device has a function of resetting the pixels DPX and a function of reading signals therefrom, and can execute the reset function and the read function at arbitrary timings.

The reset function resets the pixel DPX to a state where a photon is not input. Each pixel DPX desirably has a lens and a color filter at its light receiving surface.

Such basic functions of the pixel are similar to those of a normal pixel, except that the output of the pixel DPX does not need the accuracy and linearity of an analog value.

One example of the configuration of the digital pixel will be described.

Figure 4:
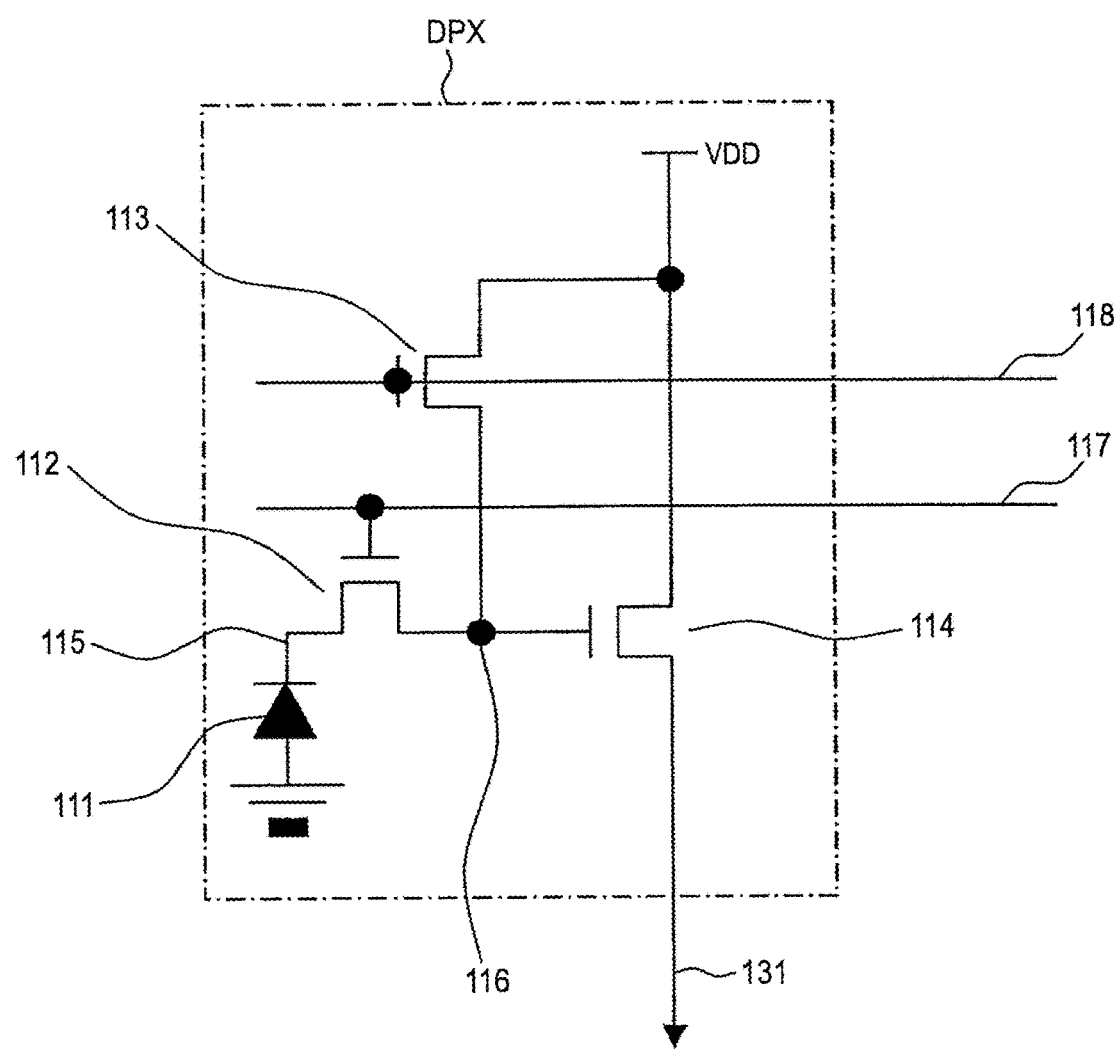
FIG. 4 is a diagram showing one example of the circuit configuration of a pixel according to the first embodiment.

FIG. 4 is a diagram showing one example of the circuit configuration of a pixel according to the embodiment.

FIG. 4 shows one example of a pixel circuit including three transistors.

A single pixel DPX pixel DPX has a photodiode 111, a transfer transistor 112, a reset transistor 113, an amplifier transistor 114, a storage node 115, and a floating diffusion (FD) node 116.

The gate electrode of the transfer transistor 112 is connected to a transfer line 117, and the gate electrode of the reset transistor 113 is connected to a reset line 118.

The amplifier transistor 114 has a gate electrode connected to the FD node 116, and a source electrode connected to the output signal line 131.

In the unit pixel DPX, light input to the silicon substrate for the pixels generates a pair of an electron and a hole, the electron being stored at the storage node 115 by the photodiode 111.

When the transfer transistor 112 is turned on at a given timing, those electrons are transferred to the FD node 116 to drive the gate of the amplifier transistor 114.

As a result, a signal charge becomes a signal to the output signal line 131 to be read out.

The output signal line 131 may be grounded via a constant current source or a resistor element to perform a source follower operation, or may be temporarily grounded before reading and then be rendered in a floating state to output a charge level set by the amplifier transistor 114.

The reset transistor 113 is turned on in parallel to and at the same time as the transfer transistor 112 to pull out the electrons stored in the photodiode 111 to the power supply, so that the pixel is reset to the dark state before electron storage, i.e., to a state where a photon is not input.

Such circuit and operational mechanism of the pixels are similar to those of an analog pixel, and, like those of the analog pixel, can have various kinds of variations.

While an analog pixel analogously outputs the total amount of input photons, however, a digital pixel digitally outputs the presence/absence of the input of a single photon.

Therefore, the design concepts of an analog pixel and a digital pixel differ from each other.

First, a digital pixel needs to generate an electric signal large enough for the input of a single photon.

In the pixel circuit with an amplifier transistor as shown in FIG. 4, for example, it is desirable to make the parasitic capacitance at the input node 116 of the amplifier transistor 114, which constitutes a source follower, as small as possible.

It is desirable to keep the amplitude of the output signal against the input of a single photon sufficiently larger than random noise of the amplifier transistor 114.

Since the output signal of the digital pixel does not need the accuracy, the linearity and the operational range of the analog pixel, a low voltage similar to that needed for a digital circuit can be used for the input/output power supply of the source follower. Further, the photodiode may need a minimum charge storage capacity.

The CMOS image sensor 100 according to the embodiment is configured to have the aforementioned first, second and third characteristic structures as follows.

The CMOS image sensor 100 has the pixel array section 110 and the sense circuit section 120 laminated using different semiconductor substrates. The CMOS image sensor 100 is configured in such a way that the pixels and the sense circuits are respectively formed in arrays, which are laminated to realize fast parallel reading without sacrificing the number of apertures.

The CMOS image sensor 100 is configured in such a way that a plurality of sense circuits share a count circuit to ensure flexible optimization of the circuit scale and the processing speed.

The CMOS image sensor 100 is configured in such a way as to have the function of adjusting the exposure time by changing the reset timing. The exposure time is adjusted by changing the reset timing, not the read timing, thereby realizing flexible pipeline to the subsequent transfer process.

Next, the outline of the general operation of the CMOS image sensor 100 according to the first embodiment will be described.

For example, all the pixels DPX are reset at the same time, and signals are read therefrom at a time after a given exposure time.

The presence/absence of a photon input to each pixel DPX within an exposure period is output as an electric signal to the output signal line 131, and is subjected to a binary decision in the corresponding sense circuit 121.

The sense circuit 121 sets "1" as a decision value when a photon is input to the selected pixel, and sets "0" as a decision value when a photon is not input to the selected pixel, and latches the decision value.

Figure 2:
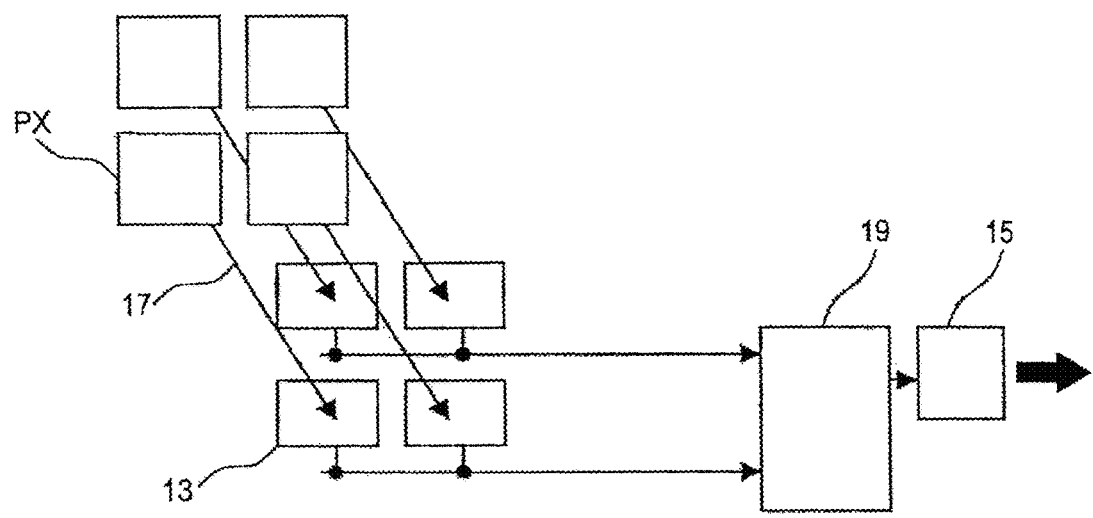
FIG. 2 is a conceptual diagram of a CMOS image sensor which has a laminate of pixels and AD converters.

That is, since the output signal from a pixel DPX is subjected to a binary decision as a digital signal according to the embodiment as different from the normal configuration as shown in FIG. 2, an AD converter is not involved here. Further, the decision speed is significantly faster than that of the AD converter.

The decision value set and latched by the sense circuit 121 is sequentially transferred to the register 152, arranged for each row, through the transfer line 141, and is subjected to a count process using the count circuit 153.

The transfer may be achieved by connecting the individual sense circuits to the common bus sequentially by switches as shown in FIG. 1, or may be achieved by using a shift register.

In the count process performed by the count circuit 153, first, pixel data read out previously is loaded into the count circuit 153 from the memory 154.

When "1" is stored in the register 152, "1" is added to the count value, and when "0" is stored in the register 152, the count value is not updated.

Thereafter, the value of the count circuit 153 is written back into the memory 154, which completes the count process for one pixel.

This process is sequentially executed for one row of pixels. While such a count process is carried out, next resetting and exposure are performed on the pixels DPX.

Such digital reading is performed 1023 times in one frame period, for example, and the total number of counts of input photons to each pixel DPX becomes 0 or greater, and 1023 or less.

Accordingly, 10-bit gradation data is generated pixel by pixel.

That is, the CMOS image sensor 100 operates as an arrayed photon counter with a unique configuration.

As mentioned above, the individual pixels DPX are disposed on a different semiconductor substrate on a support circuit which includes the associated sense circuits 121.

The pixels DPX and the sense circuits 121 are disposed in an array on the respective semiconductor substrates. For example, the pixels DPX and the sense circuits 121 are respectively formed on separate semiconductor wafers, which are in turn adhered together to achieve the laminate of the semiconductor substrates.

Further, it is desirable that at least some of the drive circuits for the pixels DPX which are to be reset or subjected to data readout be formed on the same first semiconductor substrate SUB1 as the pixels DPX are formed.

This configuration can ensure fast pixel access and fast counting in parallel, so that the aforementioned multi-acquisition of data can be carried out in one frame period.

For example, the individual pixels perform resetting and reading at a time, and data transfer and counting are performed in the individual rows at a time.

[Access Procedures]

Next, the access procedures according to the embodiment will be described.

Figure 5:
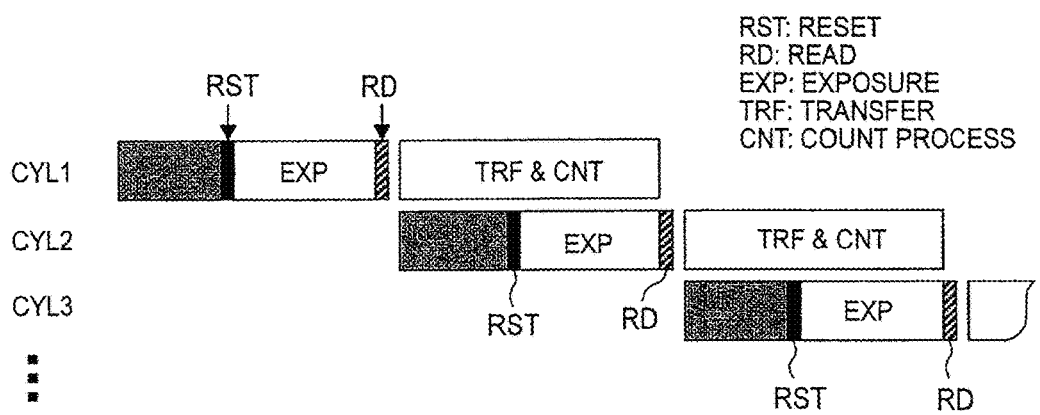
FIG. 5 is a diagram illustrating a first example of access procedures according to the first embodiment.

FIG. 5 is a diagram illustrating a first example of access procedures according to the first embodiment.

In FIG. 5, RST represents resetting, EXP represents exposure, and RD represents reading. In addition, TRF represents the transfer process, and CNT represents the count process.

In the example in FIG. 5, when one frame period is 1/30 second during which reading is carried out 1023 times, for example, one cycle of the read RD is about 32 microseconds.

In this period, the reset RST and read RD are performed on the pixels DPX, and the duration from the reset RST and the read RD is the period of the exposure EXP.

A decision value which has been latched in the sense circuit 121 in the read RD is transferred to the register 152 to be counted, at which time the exposure EXP, and the transfer pulse TRF and the count process CNT are carried out in pipeline.

That is, while the decision values which have been latched in the sense circuits 121 in the cycle CYL1 are transferred in the row direction and are counted sequentially, the pixels are subjected to the reset RST in the cycle CYL2, and the exposure EXP is initiated.

The CMOS image sensor 100 has an adjustment function of controlling the effective exposure time to adjust the sensitivity by changing the reset RST while keeping the cycle period constant.

For example, although two or more photons may be input in the exposure period in imaging a bright subject, all of them are counted as a single photon, resulting in under-counting.

In such a case, the reset timing should be set closer to the read timing to shorten the exposure time, thereby dropping the sensitivity. This can easily adjust the sensitivity during imaging without influencing other circuit operations.

The imaging system averages the count values of all the effective pixels, for example, and changes the reset timing of the imaging device to shorten the exposure time when the average count value exceeds a given value. When the average count value is lower than the given value, on the other hand, the imaging system elongates the exposure time.

It is easy to install such a function, so that the optimal exposure time can be automatically set by using the algorithm of binary search or the like.

When there is a large number of pixels, horizontal transfer and the count process need to be carried out at a high speed, which can however be suppressed by performing the transfer of each row in multiple channels using a plurality of counters.

Although it is desirable to form the count circuits 153 and the memories 154 on the same substrate as the sense circuits 121 of the sense circuit section 120 are formed, they may be disposed in lamination on a third semiconductor substrate under the sense circuit section 120.

In consideration of power consumption and nose, for example, the pixel array section 110 may be separated into a plurality of pixel blocks, so that the pixel reading operation and the transfer operation for each row are carried out block by block.

Although the sampling is carried out 1023 times to generate 10-bit gradation in the foregoing embodiment, the dynamic range can be enlarged by increasing the number of sampling actions without changing the pixels.

When the sampling number is set to 16383, about 16 times the aforementioned number, for example, one cycle is 2 microseconds.

If this cycle period is fully used for exposure, the number of photons in low illuminance mode can be counted in the same way as done normally, and the number of photons in high illuminance mode can also be counted accurately up to 16 times the number of photons in normal mode. Those numbers are expressed as 14-bit gradation data.

Alternatively, the dynamic range may be improved efficiently by acquiring data with different types of exposure periods provided.

Figure 6:
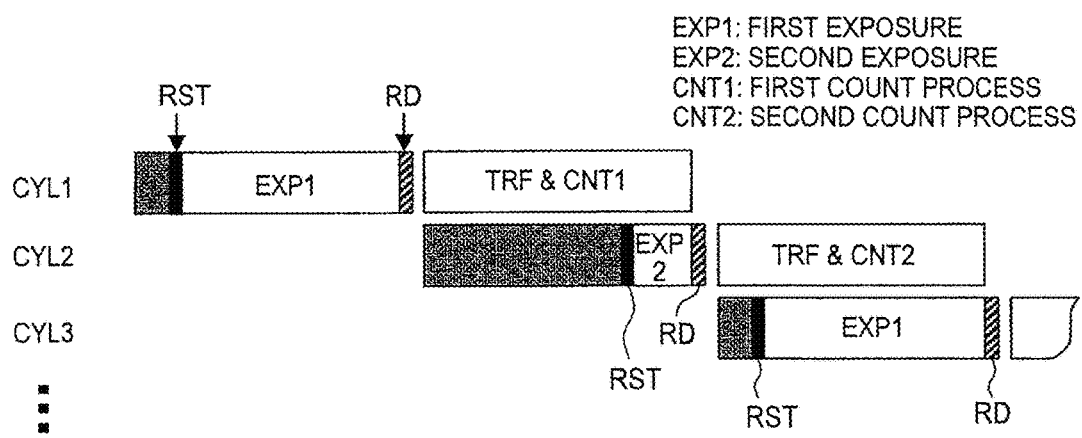
FIG. 6 is a diagram illustrating a second example of access procedures according to the first embodiment.

FIG. 6 is a diagram illustrating a second example of access procedures according to the first embodiment.

FIG. 6 shows an example where the access procedures in FIG. 5 are evolved.

In this example, the reset timing is varied to provide two exposure periods, first exposure EXP1 and second exposure EXP2, which are alternately repeated to acquire data.

The evolved use of such a technique ensures imaging in a wide dynamic range in fewer sampling actions, making it possible to reduce the load on the system.

Figure 7A:
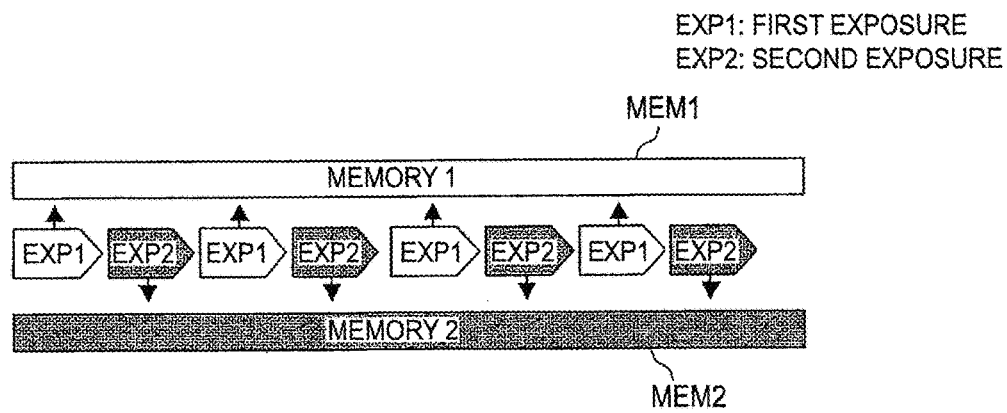
FIGS. 7A to 7C are diagrams illustrating more concrete examples of the access procedures in FIG. 6.
Figure 7B:
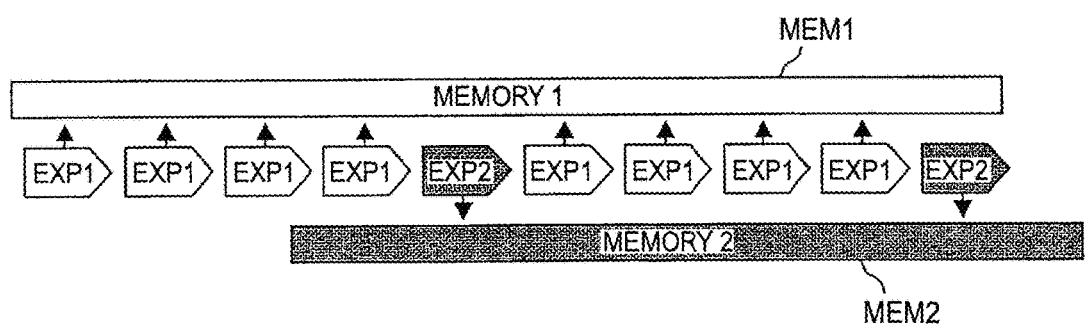
Figure 7C:
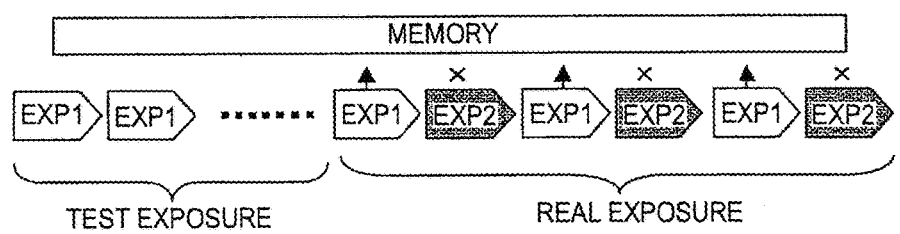

FIGS. 7A to 7C are diagrams illustrating more concrete examples of the access procedures in FIG. 6.

In each of the concrete examples in FIGS. 7A to 7C, it is assumed that the first exposure EXP1 has an exposure time eight times that of the second exposure EXP2.

In the example in FIG. 7A, data acquisition in each of the first exposure EXP1 and the second exposure EXP2 is carried out 511 times, and data is individually counted and stored in two memories, first memory MEM1 and second memory MEM2. 511 counts provide 9-bit gradation.

A pixel whose count in the first exposure EXP1 exceeds a given value is considered to have intense light input thereto, so that the count value in the second exposure EXP2 is used.

In this case, the output is set to have 12-bit gradation, for example, and the pixel for which the count value in the second exposure EXP2 is used is shifted by three bits to be eight times larger as the output.

Alternatively, the output may be structured to have 9-bit gradation and a 1-bit flag indicating selection of exposure in order to reduce the number of output bits.

In the example in FIG. 7B, to increase the imaging sensitivity of a dark subject, the number of data acquisitions in long exposure is set greater than the number of data acquisitions in short exposure.

For example, a single data acquisition in the second exposure EXP2 is repeatedly inserted for every four data acquisitions in the first exposure EXP1, for example. Accordingly, data is acquired 1023 times in the first exposure EXP1, and 255 times in the second exposure EXP2.

When the count in the second exposure EXP2 is used as the output, the output is shifted by five bits, for example, to be 32 times larger as the output in consideration of the number of exposures.

At this time, the output can have 13-bit gradation at a maximum. Alternatively, the output may be structured to have 10-bit gradation and a 1-bit flag indicating selection of exposure.

In the example in FIG. 7C, to save the memory, test data is acquired 127 times in the first exposure EXP1 first, and then data is acquired 512 times alternately in the first exposure EXP1 and in the second exposure EXP2 each.

A pixel whose count in the first exposure EXP1 exceeds a given value in the first 127 data acquisitions is considered to have intense light input thereto, so that a flag is set. When acquisition of the test data is completed, the count value in the memory is cleared once, except for the flag. For the pixel with the flag set, data only in the second exposure EXP2 is counted and stored in the memory thereafter.

For a pixel having no flag set, data only in the first exposure EXP1 is counted and stored in the memory. The memory that is needed for the counting operation per pixel is one 10-bit memory which has a flag in addition to 9-bit gradation.

It is to be noted that when the first exposure EXP1 is selected, the gradation of the memory may be increased after test, instead of clearing the memory.

Plural sets of exposure periods are provided by varying the reset timing, and data is read multiple times in each exposure period to generate imaged data in the above manner, making it possible to execute imaging over a wide dynamic range that copes with a subject with a high contrast which includes both a bright part and a dark part.

Although two types of exposure periods are used in the foregoing example, three or more types of exposure periods may be used to provide a variety of modifications to the synthesis algorithm.

It is desirable to synthesize imaged data with the number of input photons in a short exposure period being basically used for a pixel with high illuminance while the number of input photons in a long exposure period is generally used for a pixel with low illuminance. Alternatively, count values in plural types of exposures may be output, and data synthesis may be carried out at the time of image processing using a DSP chip or the like located at a subsequent stage.

Although synthesis of imaged data with varied exposure times is partially carried out by an existing image sensor, data acquisition at two types of exposure times is carried out at an interval of one frame time, which brings about a problem such as a dynamic subject being colored with unnatural colors.

The present scheme of alternately executing acquisition of both data multiple times in one frame period does not have such a problem.

More generally, it is desirable that data acquisition with cyclic exposure times should be carried out multiple times, and the acquisition results should be synthesized to generate image data.

<3. Second Embodiment>

Figure 8:
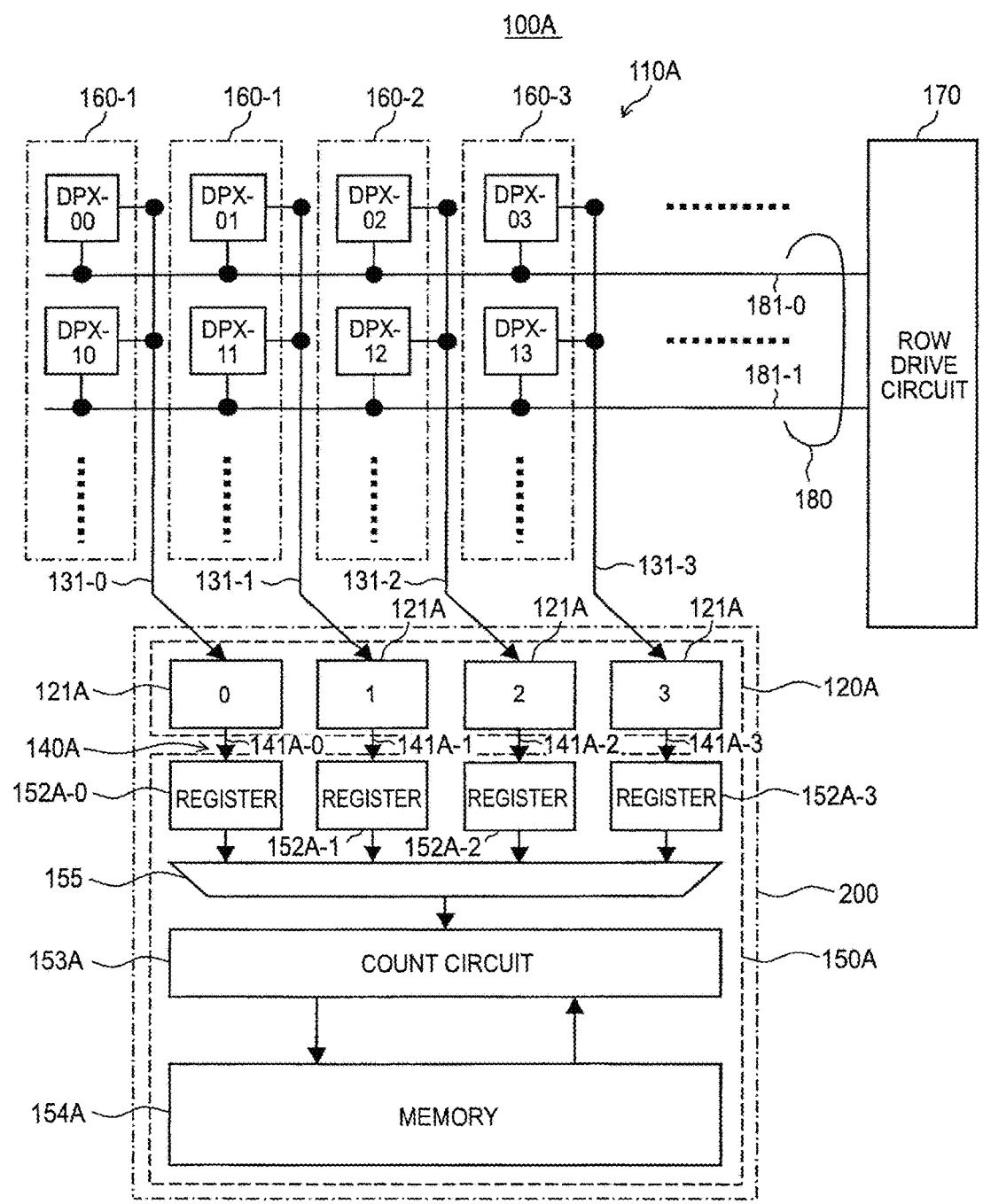
FIG. 8 is a diagram showing an example of the configuration of a CMOS image sensor (imaging device) according to a second embodiment of the invention.

FIG. 8 is a diagram showing an example of the configuration of a CMOS image sensor (imaging device) according to a second embodiment of the invention.

In the CMOS image sensor 100 according to the first embodiment, the individual pixels DPX correspond one to one to the sense circuits 121.

However, the spaces required for the pixels DPX and the sense circuits 121 should not necessarily be the same.

In addition, with the laminate of two substrates, the count circuits and memories which are large in size may be laid out outside the pixel array region in which fast and long distance transfer of data from each sense circuit 121 is essential, and is likely to be restricted by the layout.

A CMOS image sensor 100A according to the second embodiment provides a flexible solution to the above problem by allowing a plurality of pixels to share a single sense circuit.

In the CMOS image sensor 100A, a pixel array section 110A has a plurality of pixels DPX laid out in a matrix form in the row direction and in the column direction.

A plurality of pixels DPX in the same column and a selection circuit form a pixel block 160-0, 160-1, 160-2, 160-3, . . . .

The CMOS image sensor 100A includes a row drive circuit 170 and row control lines 180 for driving the pixels DPX in the pixel array section 110A to output electric signals of the pixels DPX to output signal lines 131.

The CMOS image sensor 100A includes a circuit block 200 which performs binary decision on the electric signals transferred through the output signal lines 131, and integrates decision results multiple times, pixel by pixel, to generate two-dimensional imaged data with gradation.

The circuit block 200 has a sense circuit section 120A and a decision result IC section 150A provided therein.

The sense circuit section 120A has sense circuits 121-0, 121-1, 121-2, 121-3, . . . laid out in correspondence to the pixel blocks 160-0, 160-1, 160-2, 160-3, . . . .

The sense circuit 121-0 has its input connected to an output signal line 131-0 to which the outputs of all the pixels DPX-00, DPX-10, . . . , DPX-150 forming the pixel block 160-0 are commonly connected.

That is, the pixels DPX-00, DPX-10, . . . , DPX-150 share the single sense circuit 121-0.

The sense circuit 121-1 has its input connected to an output signal line 131-1 to which the outputs of all the pixels DPX-01, DPX-11, . . . , DPX-151 forming the pixel block 160-1 are commonly connected.

That is, the pixels DPX-01, DPX-11, . . . , DPX-151 share the single sense circuit 121-1.

The sense circuit 121-2 has its input connected to an output signal line 131-2 to which the outputs of all the pixels DPX-02, DPX-12, . . . , DPX-152 forming the pixel block 160-2 are commonly connected.

That is, the pixels DPX-02, DPX-12, . . . , DPX-152 share the single sense circuit 121-2.

The sense circuit 121-3 has its input connected to an output signal line 131-3 to which the outputs of all the pixels DPX-03, DPX-13, . . . , DPX-153 forming the pixel block 160-3 are commonly connected.

That is, the pixels DPX-03, DPX-13, . . . , DPX-153 share the single sense circuit 121-3.

For other pixel blocks (not shown), sense circuits are laid out in the sense circuit section 120A in such a way that each sense circuit is shared by a plurality of pixels.

The decision result IC section 150A has a capability of integrating decision results from the sense circuits 121-0 to 121-3 multiple times, pixel by pixel, to generate two-dimensional imaged data with gradation.

The decision result IC section 150A has registers 152A-0 to 152A-3, a selection circuit 155, a count circuit 153A, and a memory 154A.

The registers 152A-0 to 152A-3 hold decision values in the respective sense circuits 121-0 to 121-3 which have been transferred through transfer lines 141A-0 to 141A-3.

The selection circuit 155 sequentially selects the outputs of the registers 152A-0 to 152A-3 to supply the decision values held in the registers 152A-0 to 152A-3 to the count circuit 153A.

The count circuit 153A sequentially performs a count process on the decision values from a plurality of pixels (four pixels in this embodiment) whose row has been selected to be readout and which have been supplied via the selection circuit 155, and stores a counting result for each pixel in the memory 154A.

Data on pixels previously read out is loaded into the count circuit 153A from the memory 154A.

The decision result IC section 150A according to the second embodiment has the single count circuit 153A which is shared by a plurality of the registers 152A-0 to 152A-3.

In other words, the CMOS image sensor 100A according to the second embodiment allows a plurality of sense circuits 121A-0 to 121A-3 to share the count circuit 153A.

The CMOS image sensor 100A according to the embodiment is configured to include the aforementioned fourth characteristic structure.

That is, the CMOS image sensor 100A is configured in such a way that a plurality of pixels share a sense circuit, and are cyclically accessed to ensure the exposure time and cope with smaller pixels.

Further, the CMOS image sensor 100A is configured in such a way that a plurality of sense circuits share a count circuit to achieve flexible optimization of the circuit scale and the processing speed.

Next, the outline of the general operation of the CMOS image sensor 100A according to the second embodiment will be described.

As mentioned above, the pixel block 160 (160-0, 160-1, 160-2, 160-3, . . . ) is configured to include 16 digital pixels DPX and a selection circuit. The selection circuit selects one of the pixels, and resets or read data from the selected pixel.

In this embodiment, one pixel in the pixel block 160 is selected according to the row control line 181 which is driven by the row drive circuit 170.

At the time of reading, presence/absence of a photon input to the selected pixel is output to the output signal line 131 (131-0, 131-1, 131-2, 131-3, . . . ) as an electric signal, which is in turn subjected to binary decision in the sense circuit 121A (121A-0, 121A-1, 121A-2, 121A-3, . . . ).

The sense circuit 121A (121A-0, 121A-1, 121A-2, 121A-3) sets "1" as a decision value, for example, when a photon is input to the selected pixel, and sets "0" as a decision value when a photon is not input to the selected pixel, and latches the decision value.

The decision values in the sense circuit 121A (121A-0, 121A-1, 121A-2, 121A-3, . . . ) are first transferred to the register 152A (152A-0, 152A-1, 152A-2, 152A-3).

The count circuit 153A is shared by four pixel blocks 160-0 to 160-3, and a count process is sequentially performed on data from the four pixels in a row, selected and read, via the selection circuit 155.

Then, the counting result for each pixel is stored in the memory 154A.

That is, data of the previously read pixel is loaded into the count circuit 153A from the memory 154A.

The count value is incremented by "1" when "1" is stored in the register 152A (152A-0, 152A-1, 152A-2, 152A-3), and is not updated when "0" is stored therein.

Thereafter, the value of the count circuit 153A is written back into the memory 154A, which completes the count process for one pixel. This process is sequentially executed on the four pixels.

While such a count process is carried out, the pixel block 160 (160-0, 160-1, 160-2, 160-3), and the sense circuit 121A (121A-0, 121A-1, 121A-2, 121A-3) can make data reading and decision on the next row in parallel.

Such digital reading is carried out, for example, 1023 times in one frame period to generate 10-bit gradation data for each pixel.

At this time, the count circuit 153A has a size of 10 bits, and the memory 154A has a capacity of 640 bits for each of 16×4 pixels has 10-bit data.

That is, the CMOS image sensor 100A operates as an arrayed photon counter having a unique configuration.

In case of this configuration, when the number of rows of the pixel array is the number of rows in one block, and blocks are laid out only in the column direction, it is possible to form all the circuits on the same semiconductor substrate.

When the imaging device has a lot of pixels, however, it is desirable that the pixel blocks 160-0, 160-1, 160-2, 160-3 should be formed in lamination on different semiconductor substrates on a support circuit including the respective sense circuits 121A-0, 121A-1, 121A-2, 121A-3.

Then, it is desirable that the pixel array section 110A including the pixel blocks 160-0, 160-1, 160-2, 160-3, and the sense circuits 121A-0, 121A-1, 121A-2, 121A-3 should be laid out in an array on different semiconductor substrates respectively.

In other words, it is desirable that the pixel array section 110A including the pixel blocks 160-0, 160-1, 160-2, 160-3, and the sense circuit section 120A including the sense circuits 121A-0, 121A-1, 121A-2, 121A-3 should be laid out in an array on different semiconductor substrates respectively.

It is further desirable that the sense circuit sections 120A should be formed on a substrate as the circuit blocks 200 each including the count circuit 153A and the memory 154A, and be laid out in an array. Alternatively, the memories 154A may be disposed in lamination on a third semiconductor substrate under the sense circuits.

Next, the cyclic access to pixel blocks according to the second embodiment will be described below.

Figure 9:
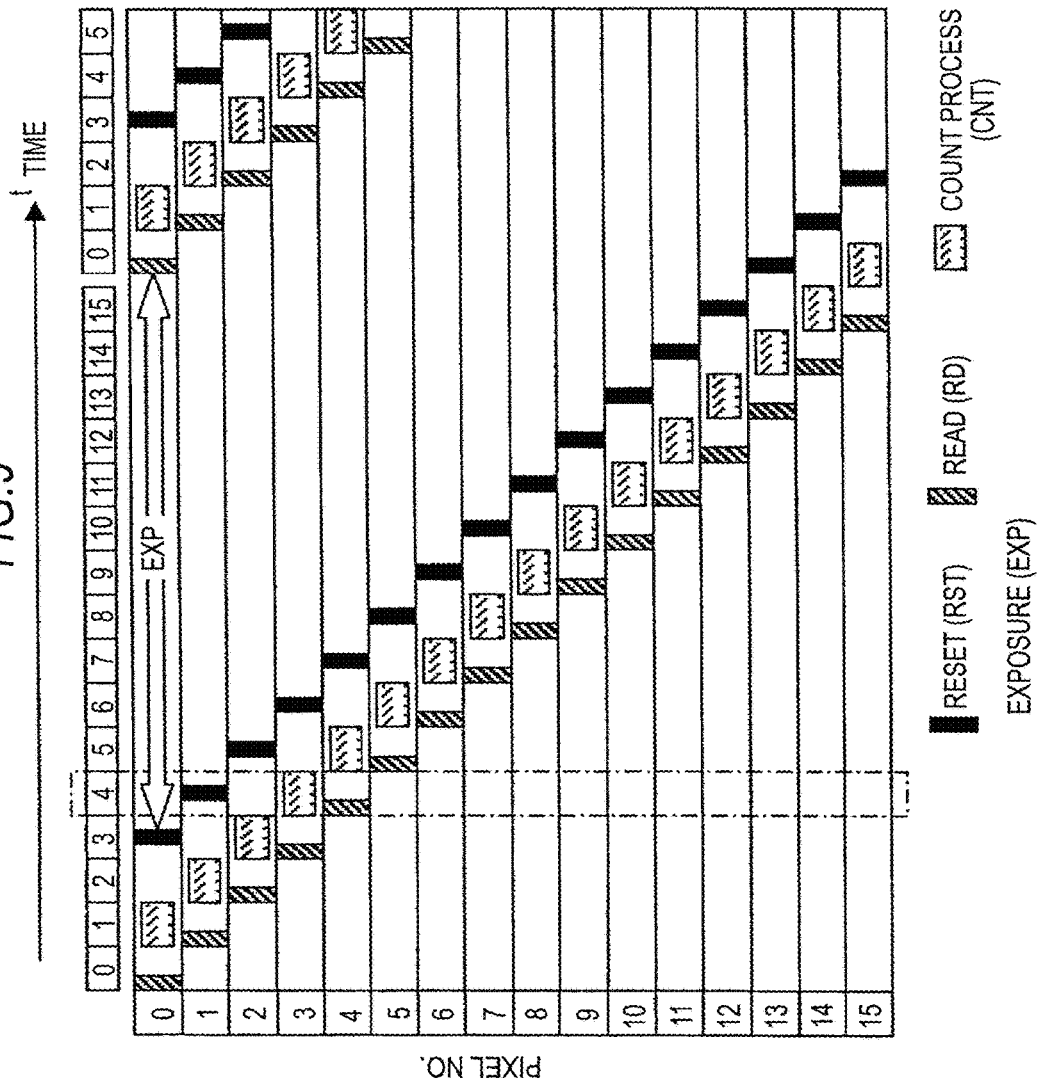
FIG. 9 is a diagram for explaining a cyclic access to pixel blocks according to the second embodiment.

FIG. 9 is a diagram for explaining the cyclic access to pixel blocks according to the second embodiment.

It is assumed here that when all of the arrayed pixel blocks operate approximately in parallel, accesses to the individual pixels are represented by an access to a single pixel block regardless of how many pixels are provided in the imaging device.

Sixteen pixels included in each pixel block 160 (160-0, 160-1, 160-2, 160-3, . . . ) are accessed sequentially and cyclically.

Given that the frame rate is 1/30 second during which reading is carried out 1023 times for each pixel, one cycle of the block process is approximately 32 microseconds during which reading of 16 pixels needs to be completed.

The time section along the horizontal axis in FIG. 9 represents time t which is assigned to an access for each pixel in a block, and which has a maximum width of 2 microseconds.

Since data reading from each pixel and a decision on the data are simple operations similar to reading from a semiconductor memory, the time width has a sufficient margin.

In the above cyclic access, reset RST and read RD of the individual pixels DPX are carried out cyclically.

In this case, although the access timing differs pixel by pixel, the substantial time of exposure EXP from the reset RST to the read RD is uniform for all the pixels.

The exposure time can be varied by changing the timing of the reset RST within the cycle range, so that the sensitivity can be adjusted without influencing other circuit operations.

If the reset RST for each pixel DPX is set immediately after the previous read RD (in the same time section to which the reading belongs), for example, the exposure time becomes maximum to cope with imaging of a subject with low illuminance.

If the reset RST is set immediately prior to the read RD (in the time section preceeding by one to the reading), on the other hand, the exposure time becomes minimum to cope with imaging of a subject with high illuminance. Alternatively, if the reset timing is set variable in several levels within the same time section, the exposure time can be selected more freely.

The count process CNT follows the read RD, and reading of a next pixel is initiated in parallel.

At time t4, for example, a pixel No. 4 is read, and a pixel No. 1 is reset. In parallel to the operation, a count process is performed on a pixel No. 3.

Although reading of the pixel No. 4 and resetting of the pixel No. 1 are executed in serial in a time-divisional manner in this embodiment, reading and resetting of pixels provided with independent reset mechanism therein as shown in FIG. 4 can both be carried out in parallel at a time with two row control lines are driven.

According to the second embodiment, with different exposure times set by changing the reset timing, it is possible to perform data acquisition multiple times, and generate imaged data using the data acquisition.

Specifically, the data acquisition needs to be performed according to schemes shown in FIGS. 7A to 7C which have been described in the foregoing description of the first embodiment, making it possible to imaging in a wide dynamic range which is compatible with imaging of a subject with high contrast.

As described above, the second embodiment has a hierarchical structure where a plurality of pixels DPX share the sense circuit 121A (121A-0, 121A-1, 121A-2, 121A-3) and the register 152A (152A-0, 152A-1, 152A-2, 152A-3), and a plurality of sense circuits 121A (121A-0, 121A-1, 121A-2, 121A-3) share the count circuit 153A.

Sharing those circuits at what ratio is optimized by the relation between the aforementioned access time and the occupation spaces of the individual circuits.

Since the access time of one pixel has a sufficient allowance in the embodiment, for example, a larger number of pixels may share a sense circuit, or a larger number of sense circuits may share a count circuit.

Figure 10:
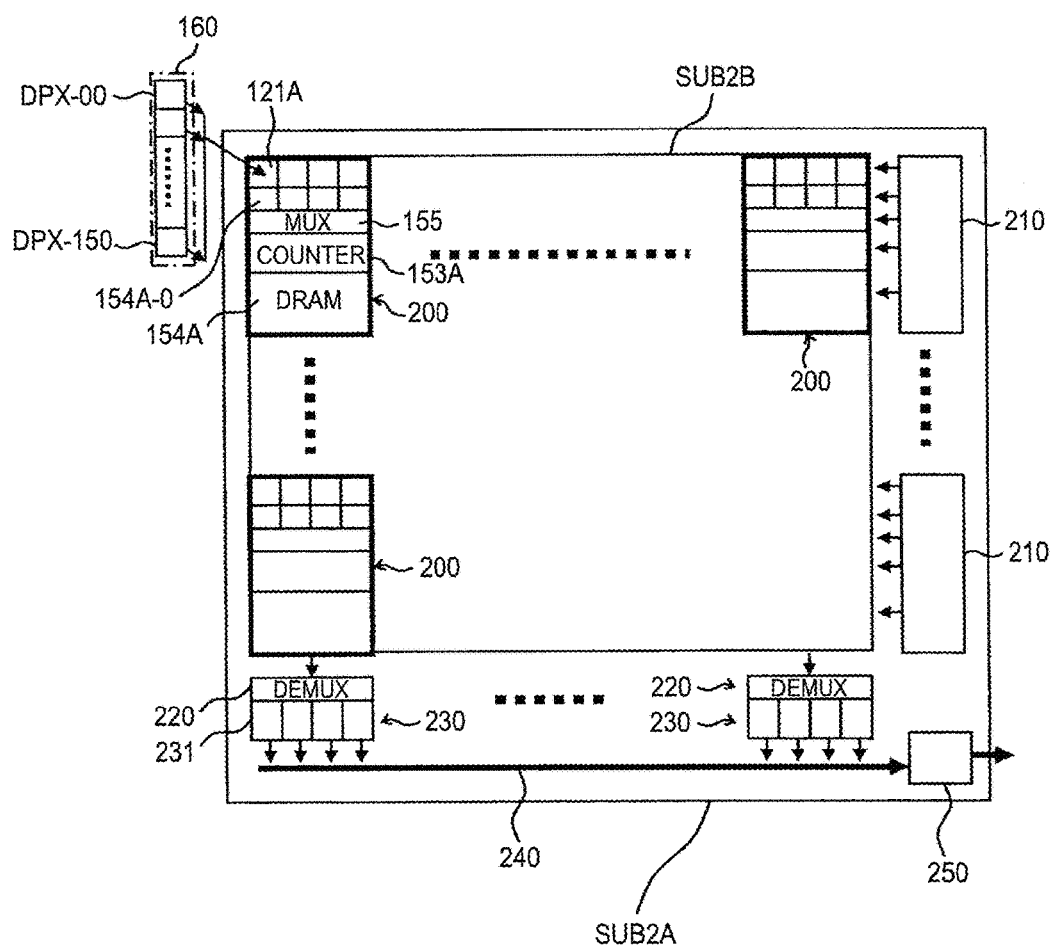
FIG. 10 is a diagram showing the general image of a chip in according to the second embodiment shown in FIG. 8.

FIG. 10 is a diagram showing the general image of a chip in according to the second embodiment shown in FIG. 8.

A plurality of circuit blocks 200 are laid out in an array on a semiconductor substrate SUB2A in the example in FIG. 10.

The plurality of circuit blocks 200 are laid out in an array. Formed on the semiconductor substrate SUB2A are a control circuit 210 which controls a plurality of circuit blocks 200, a demultiplexer (DEMUX) 220 for demultiplexing the outputs of the circuit blocks 200, registers 230, a transfer line 240, and an output circuit 250.

In FIG. 10, output data from the pixel block 160 including a plurality of pixels DPX and a selection circuit is subjected to a decision in the sense circuit 121A-0, and is then transferred to the register 152A.

A plurality of registers 152A-0 to 152A-3 share the count circuit 153A via the selection circuit 155, and counting results are stored in the memory 154A which is, for example, a dynamic RAM (DRAM).

The circuit blocks 200 are laid out in an array on the semiconductor substrate SUB2A, and operate in parallel at a time to make a decision on the data from the pixels selected in each circuit block 200 and count the number of input photons.

The timing-based supply of data to the circuit blocks 200 and the row driving of the memories 154A are carried out together for the circuit blocks 200 laid out in the row direction by the control circuit 210 disposed for each row.

The circuit blocks 200 are laid out in an array on a different semiconductor substrate SUB2B laminated on the semiconductor substrate SUB2A.

It is desirable that the circuit blocks 200, and a group of the pixel blocks 160 corresponding thereto should be disposed at the same pitches, so that the individual pixel blocks 160 and the respective sense circuits are connected adequately.

when counting for one frame is completed, the counting results stored in the memories 154A are latched in the registers 231 in the register group 230 via the demultiplexer 220 one row of the pixel array at a time.

When data of all the rows forming a frame is output, the process for one frame is completed.

This output mode is compatible with the output mode of the normal imaging device which sequentially outputs frame data row by row.

When all the pixels are driven to smoothly image a subject as a dynamic image, it is desirable to have two memories 154A for the count and output operations, and to have memories for two frames of pixels in all the pixels as a whole.

In this case, the two memories are used, switched alternately from one to the other frame by frame, so that while one memory is used for the count operation, the other one is used for the output operation.

Alternately, memories for one frame may be separated into two groups, an odd row and an even row, and the interline operation may be carried out to output data from the even row while pixels in the odd row are exposed and counted, and to output data from the odd row while pixels in the even row are exposed and counted.

There may be a case where it is desirable to reduce the amount of data to be output according to the application of the imaging device. For example, imaged data from all the effective pixels is used for a static image, while it is frequently desirable to reduce the number of pixels to reduce the amount of data for a dynamic image.

To cope with such a case, some imaging devices have a capability of adding up data of a plurality of pixels, and outputting the data as data for one pixel. Such addition is normally carried out with an adder separately provided, which increases the circuit occupation space accordingly.

According to the embodiment, by way of contrast, the storage location in a memory is shared by a plurality of pixels which shares a count circuit, so that addition of pixel data can be carried out very easily and flexibly.

According to the first embodiment shown in FIG. 3, for example, a plurality of pixels which share the count circuit 153 at least in the row direction are allowed to share the storage location in the memory 154 to be able to add data from the pixels.

Alternatively, according to the second embodiment as shown in FIG. 8, a plurality of pixels which share the count circuit 153A are allowed to share the storage location in the memory 154A to be able to effect flexible addition of pixel data both in the row direction and in the column direction.

At the time of performing such addition, the amount of the memory in use is saved to become, for example, ¼ in the case of addition of data of four pixels.

When all the pixels are used for a static image and pixel data is added for a dynamic image, therefore, the entire memory 154A in FIG. 10 needs to be one frame of pixels in the entire pixels.

One frame is entirely used for a static image, while, for a dynamic image, the memory is reduced in the addition and separated into two memories, which are used, switched alternately from one to the other frame by frame, for the count operation and the output operation.

Any of those operations can be effected merely by changing the address to be selected at the time of accessing the memories, and can be controlled easily.

According to the embodiment, counted data stored in the memories 154, 154A are output directly. The data in those memories can be accessed at random pixel by pixel as data of a frame memory, so that an image processing circuit, such as a DSP, may be further mounted on the semiconductor substrate SUB2, SUB2A to perform image processing, such as correction of defects, de-mosaic operation and compression.

Further, addition of data of a plurality of pixels has an advantage that with a group of pixels whose data is to be added being regarded as a single light receiving unit, the dynamic range of the output thereof can be improved. When 10-bit counting is performed for each pixel, for example, the output of adding data of four pixels will have 12 bits.

This addition can be performed flexibly according to the application; pixel data arranged in a two-dimensional array may be added for each pixel group which shares a counter, and an adder may further be provided at the output stage to add data of pixel groups at the time of outputting the data.

Executing such step-by-step addition facilitates addition of all the pixels so that the pixels can be used as a single photon counter. In this case, the photon counter will have a huge dynamic range according to the number of pixels.

As mentioned above, each of the digital pixels to be used in the embodiment has a photoelectric converting device and a function of outputting an electric signal according to a photon input, and is configured as shown in FIG. 4, for example.

At the time of reading data from digital pixels, it is desirable to provide the following self-referring function in sensing mode to cancel out a variation in output from one pixel to another.

That is, an output in a reset state and a signal output after exposure are read from a pixel, and a sense circuit compares both outputs with each other with a given offset added to one of them to make a binary decision.

FIG. 11 is a circuit diagram showing one example of a sense circuit having a self-referring function.

A sense circuit 121B in FIG. 11 has switches SW121, SW122, SW123, capacitors C121, C122, inverters IV121, IV122, and a supply line L121 for an offset signal OFFSET.

The switch SW121 has a terminal a connected to a first terminal of the capacitor C121, and a first terminal of the capacitor C122, and a terminal b connected to a terminal SIG which is connected to an output signal line.

The second terminal of the capacitor C121 is connected to the input terminal of the inverter IV121, a terminal a of the switch SW122, and a terminal a of the switch SW123.

The output terminal of the inverter IV121 is connected to the input terminal of the inverter IV122 and a terminal b of the switch SW122.

The output terminal of the inverter IV122 is connected to a terminal b of the switch SW123 and an output terminal SAOUT.

An example of a reading operation using the sense circuit with the self-referring function as shown in FIG. 11 will be described referring to the pixel in FIG. 4 by way of example.

FIGS. 12A to 12F present a timing chart for explaining an example of a reading operation using the sense circuit with the self-referring function in FIG. 11 referring to the pixel in FIG. 4 by way of example.

FIG. 12A shows a reset pulse RESET to be applied to the reset line 118 in FIG. 4, and FIG. 12B shows a read pulse READ to be applied to the transfer line 117 in FIG. 4.

FIG. 12C shows the ON/OFF state of the switch SW121, FIG. 12D shows the ON/OFF state of the switch SW122, FIG. 12E shows the ON/OFF state of the switch SW123, and FIG. 12F shows the offset signal OFFSET.

First, the switch SW121 and the switch SW122 are set on (ON) to apply the reset pulse RESET to the reset line 118, and read a pixel output in the reset state onto the input terminal SIG.

Next, the switch SW122 is set off (OFF) to hold the reset output.

Then, the pulse READ is applied to the transfer line 117 for the pixel DPX to input a signal output representing the exposure result to the terminal SIG, thereby setting off the switch SW121.

During that period, the offset signal OFFSET input is kept 0 V.

Next, the level of the offset signal OFFSET is slightly increased to add an offset potential to the read signal via the capacitor C122.

As a result, the pixel output in the reset state and the output with a slight offset added to the read signal are compared with each other.

When a photon is input to the pixel in FIG. 4, the latter signal is lower in potential than the former signal, so that "0" is output to the output terminal SAOUT.

When a photon is not input to the pixel, the opposite comparison result is obtained, so that "1" is output to the output terminal SAOUT.

Finally, the switch SW123 is set on to latch the decision result.

This self-referring function can cancel out fixed noise for each pixel originating from a variation or the like in the threshold value of the amplifier transistor 114, and ensure an accurate binary decision even on a minute signal. Further, reset-originated kTC noise is also canceled out in the above sequence.

A similar effect can be expected even in correlated double sampling (CDS) in AD conversion of an analog signal.

It is to be noted that since the periods needed for two readings and decisions are always constant in binary decision sensing, the influence of thermal noise or flicker noise generated by the amplifier transistor of the pixel and the sense circuit themselves can be reduced as follows.

Since most of low-frequency band noise also appears (is superimposed) in both readings, the influence can be cancelled out, sensitivity for high-frequency band noise can be restricted by the capacitive load of the sense circuit.

Therefore, the band of influential noise can be minimized by setting the capacitive load as large as possible in an accurately sensible range.

In correlated double sampling in AD conversion, the period required for the conversion often differs according to the level of the signal and the number of bits, and is inevitably affected by the wide noise band.

The sense circuit is not limited to this example, and may be modified to compare a reset signal added with an offset with a read signal to make a decision.

Alternatively, a read signal is acquired beforehand, after which a pixel is reset, a reset signal is then acquired, and the read signal and the reset signal, with an offset added to one of the signals, are compared with each other. In this case, although kTC noise cannot be canceled out, fixed noise or the like originating from a pixel-based variation can be canceled out, so that the modification has an advantage that it is generally adaptable to any pixel configuration.

Even with the self-referring function installed, the sense circuit has considerably fewer components than the normal AD converter, and does not need large occupation space.

In case of realizing a digital pixel, it is an effective option to use an internal amplified type photodiode.

As an internal amplified type photodiode, for example, an avalanche photodiode (APD) which accelerates a pair of a photoelectrically converted electron and a hole in electric field to cause avalanche amplification is known.

In this case, the pixel circuit as shown in FIG. 4 can be used, but the pixel does not need an amplifier transistor when the self-amplified photodiode is used to acquire a sufficiently large signal.

Figure 13:
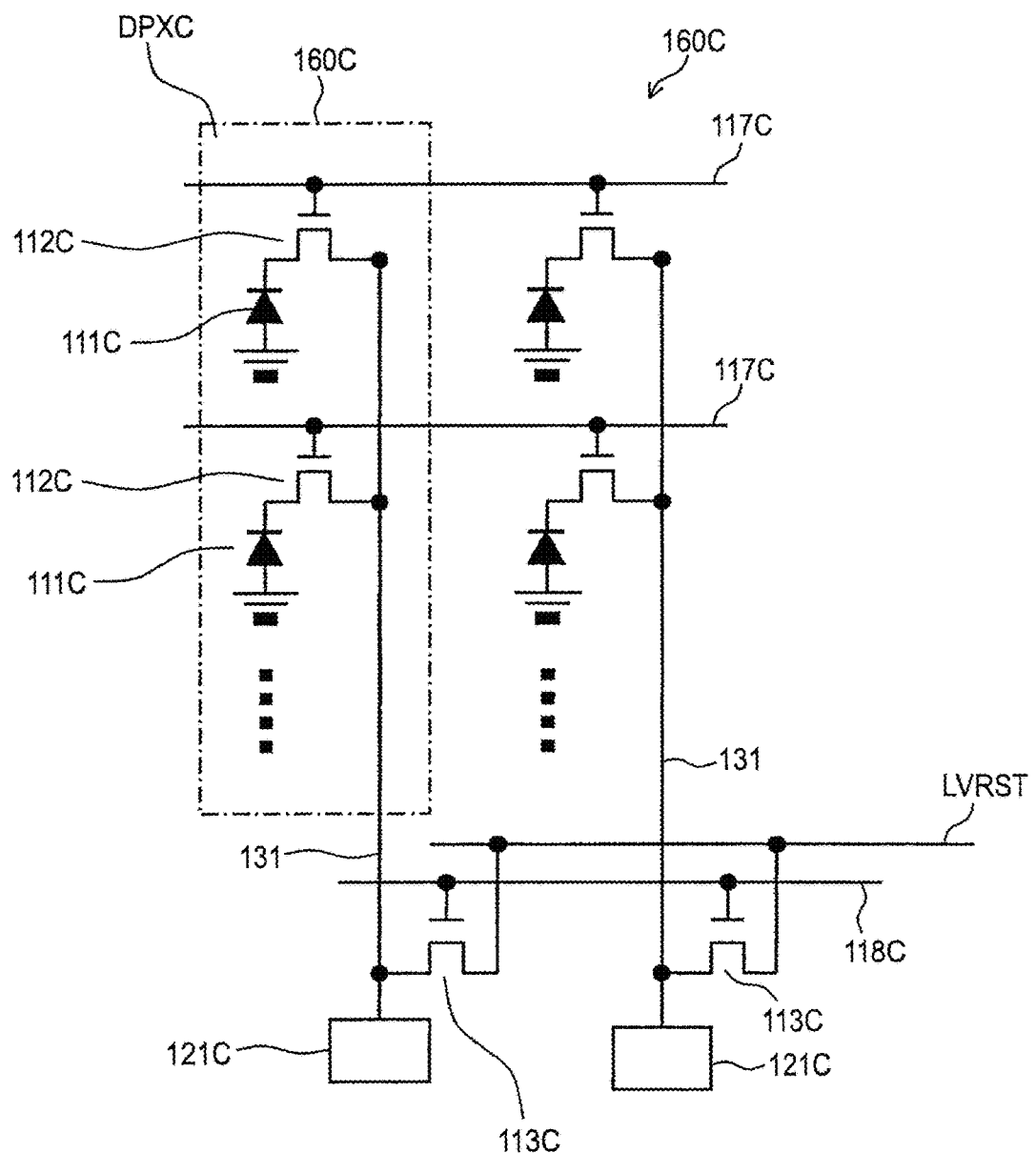
FIG. 13 is a diagram showing an example of the configuration of the pixel block corresponding to the second embodiment using an internal amplified diode.

FIG. 13 is a diagram showing an example of the configuration of the pixel block corresponding to the second embodiment using an internal amplified diode.

A pixel block 160C is formed by sets of only internal amplified photodiodes 111C and transfer (selection) transistors 112C associated therewith.

That is, a pixel DPXC in this example is formed only by an internal amplified photodiode 111C and a transfer (selection) transistor 112C associated therewith. The gate electrodes of the transfer transistors 112C of the individual pixels DPXC in the same row are connected to a common transfer line 117C. The sources or drains of the transfer transistors of a plurality of pixels in each pixel block 160C are connected to a common output signal line 131.

A reset transistor 113C is connected between each output signal line 131 and a reset potential line LVRST. The gate electrodes of the individual reset transistors 113C are connected to a common reset line 118C.

In this example, each pixel DPXC is reset via the reset transistor 113C, the output signal line 131 and the transfer transistor 112C.

When the pixel blocks 160C are laminated on the sense circuit 121C, the reset transistors 113C may belong to the substrate of the pixel blocks 160C, or may belong to the substrate of the sense circuits 121C.

In case of using adhered wafers as the laminate of semiconductor substrates, according to the manufacturing method of the related art described earlier, signal connection between the pixels and the pixel block, and between the sense circuits is assumed to be direct connection via a conductive pad electrode.

However, it is not easy to simultaneously expose a metal pad and an insulating film which differ in polishing speed, and to simultaneously polish them to provide highly accurate flat surfaces which are needed for adhesion and keep the adhesion strength.

In addition, the pad surface may be altered during polishing or before adhesion, thus causing improper insulation. When different chips are adhered, highly accurate direct connection via an electrode pad suffers a similar difficulty.

Meanwhile, transmission of digital data does not need high precision, so that direct connection is not essential, and it is sufficient to make connection by means of coupling capacitance via a capacitor.

The capacitance of the capacitor is influenced by a productional variation originating from the size of the capacitor, the thickness of a dielectric film, or the like, thus generating inherent noise which depends on the level of the signal for each capacitor. Therefore, transmission of analog signals brings about a lot of difficulties.

However, digital signals do not bring about such problems, and even a small digital signal can be read out if combined with the aforementioned self-referring function.

Figure 14:
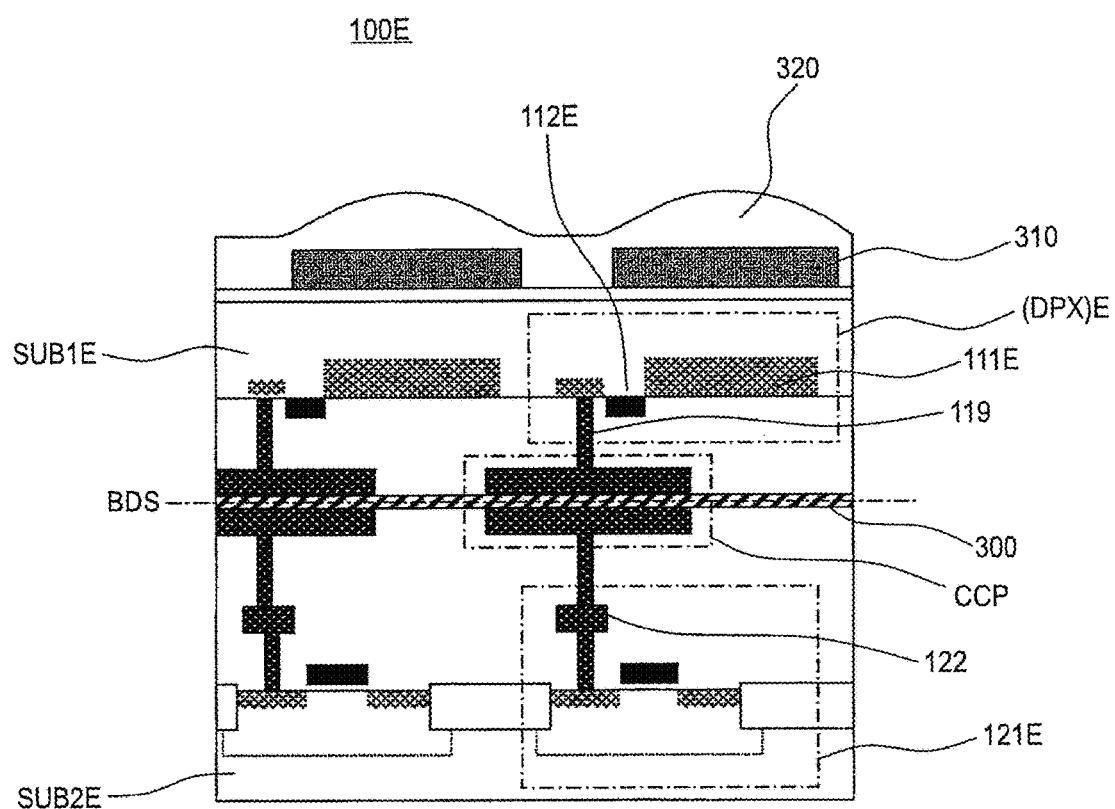
FIG. 14 is a diagram showing one example of the cross section of a CMOS image sensor which employs a coupling-capacitance based connection structure via a capacitor.

FIG. 14 is a diagram showing one example of the cross section of a CMOS image sensor 100D which employs a coupling-capacitance based connection structure via a capacitor.

In the example in FIG. 14, a digital pixel DPXE is formed on a semiconductor substrate SUB1E, so that electrons generated by a photodiode 111E are transferred to an output electrode section 119 via a transfer transistor 112E.

A sense circuit 121E is formed on a semiconductor substrate SUB2E, and receives an output signal from the pixels DPXE at an input electrode section 122.

A capacitor CCP having a high dielectric film 300 sandwiched between its electrodes is formed at a bonding surface BDS of both substrates SUB1E and SUB2E. The output electrode section 119 of the pixel DPXE and the input electrode section 122 of the sense circuit 121E are connected together via the capacitor CCP.

After adhesion of the substrates, color filters 310 and microlenses 320 are formed at the light receiving surfaces of the pixels DPXE.

The use of such a configuration can allow part of the self-referring sense circuit in FIG. 11 to be substituted by the coupling capacitor CCP to further simplify the circuit.

Figure 15:
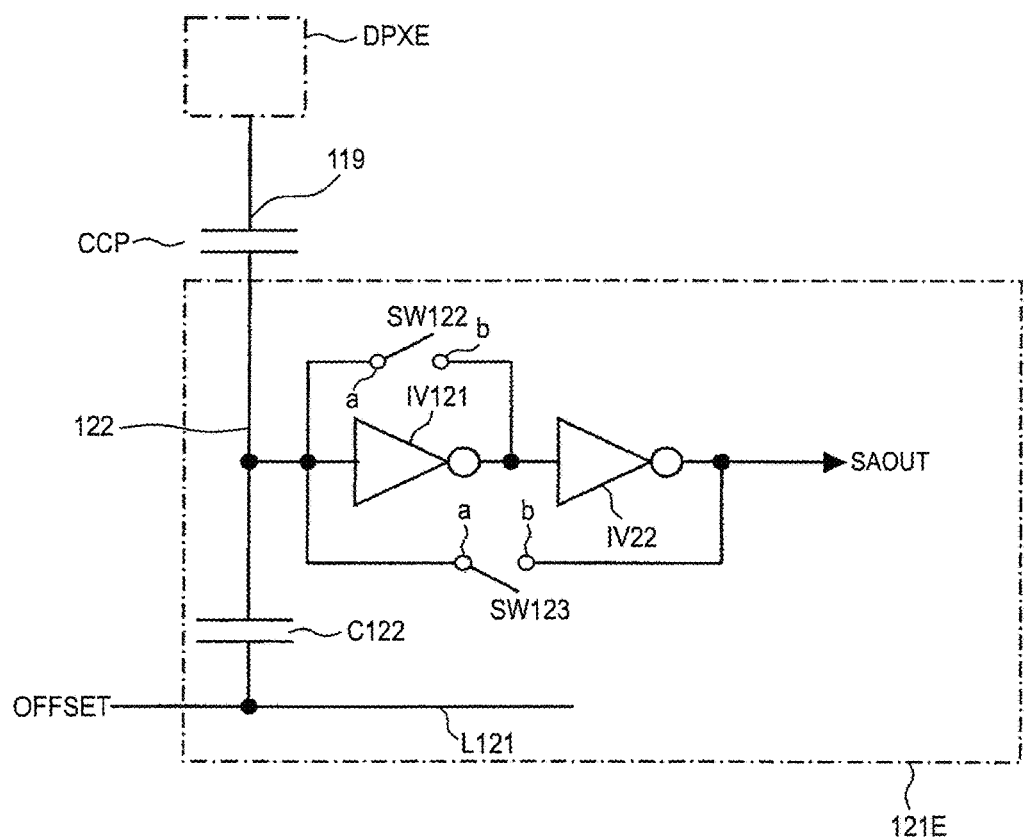
FIG. 15 is a circuit diagram showing one example of a sense circuit with a self-referring function in the CMOS image sensor which employs the coupling-capacitance based connection structure via a capacitor.

FIG. 15 is a circuit diagram showing one example of a sense circuit with a self-referring function in the CMOS image sensor which employs the coupling-capacitance based connection structure via a capacitor.

Those components of the sense circuit in FIG. 15 which are the same as the components in FIG. 11 are denoted by same reference numerals.

The sense circuit 121E in FIG. 15 is configured not to have the switch SW121 and the capacitor C121 of the sense circuit 121B in FIG. 11.

The digital pixel DPXE, as described above in conjunction with FIGS. 11 and 12, outputs a reset level to the output electrode section 119 first.

The sense circuit 121E sets on the switch SW122, then sets it off to hold the reset level signal transferred via the coupling capacitor (CCP) in the input electrode section 122 which is the node set in a floating state.

That is, when the reset level is input to the output electrode section 119, charges which cause the input electrode section 122 to reach the threshold value of the inverter are stored in the input electrode section 122 that serve as a storage node.

Thereafter, the digital pixel DPXE outputs a signal level to the output electrode section 119.

Further, the level of the offset signal OFFSET is shifted slightly to the positive potential side to add a slight offset to the read signal. As a result, the inverters IV121, IV122 are driven to output a decision result to the output terminal SAOUT.

Finally, the switch SW123 is set on to latch the decision result.

In such a case, the coupling capacitor CCP can be interpreted as part of the sense circuit.

Signal transmission through coupling of the capacitor as described referring to FIGS. 14 and 15 can also be carried out according to the second embodiment where a plurality of pixels correspond to a single sense circuit.

In the second embodiment, the output electrode section 119 extending from the pixel is shared by a plurality of pixels in the pixel block.

<4. Third Embodiment>

FIG. 16 is a diagram showing an example of the configuration of a CMOS image sensor (imaging device) according to a third embodiment of the invention.

A CMOS image sensor 100B according to the third embodiment has a function of repeatedly executing binary decision on presence/absence of a photon input to a pixel in a predetermined exposure time, multiple times in a unit frame period, and integrating decision results to derive the amount of photons input to the light receiving section.

The CMOS image sensor 100B also has a function of variably setting the cycle period for decision within a plurality of cycle periods according to N times the unit cycle period (where N is an integer).

The CMOS image sensor 100B further has a mode of deriving the amount of photons input in the same unit frame period in fewer decisions in a long cycle period, and a mode of deriving the amount of photons input in many decisions in a short cycle period.

The CMOS image sensor 100B further has a function of cyclically repeating multiple decisions including a decision in a short cycle period and a decision in a long cycle period multiple times within the unit frame period, combining and integrating the decision results to derive the amount of photons input to the light receiving section.

In other words, the CMOS image sensor 100B has the optimal configuration to set the exposure of an imager using time-divisional photon counting.

That is, while it is desirable that the actual exposure time is longer to obtain a sufficient sensitivity in exposure with low illuminance, many decision counts are not needed.

To obtain a high S/N ratio with high illuminance, the total number of counts has a priority over the actual exposure time. For example, even when 400 nanoseconds are used in the read operation as discussed above, a maximum of 16,666 counts in total can be secured if the cycle time for decision is set to 1 microsecond.

At this time, the exposure time at most 60 percent of the frame period can be secured, which hardly matters in imaging with high illuminance.

At the time of imaging with low illuminance, on the other hand, the cycle time for decision has only to be set to four times or 4 microseconds, for example, to secure the exposure time which is 90 percent of the frame period.

The installation of the function of changing the cycle period for decision to N times (N being an integer) basically does not need to change the operational timing of the circuit, except for setting the execution frequency of the read-and-decide operation to 1/N. Therefore, the control is easy, and the circuit scale is hardly increased.

Further, a set of a plurality of decisions at different cycle times may be repeated within the unit frame period to make it possible to cope with imaging of a subject with high contrast, which includes a high illumination portion and a low illumination portion, and to secure a sufficient exposure time for the low illumination portion.

According to the third embodiment, as apparent from the above, the number of decision counts can be increased at the time of imaging with high illuminance in the time-divisional photon counting to secure a high S/N ratio for photo shot noise, and to secure a sufficient exposure time for the low illumination portion in addition.

Further, it is possible to cope with imaging of a subject with high contrast, which includes a high illumination portion and a low illumination portion, color shifting of a dynamic subject does not occur, and a sufficient exposure time can be secured for the low illumination portion. Furthermore, at the time of imaging with low illuminance, power consumption can be reduced considerably.

The following will describe specific configurations and functions.

FIG. 16 is a diagram showing an example of the configuration of an imaging device based on time-divisional photon counting.

A CMOS image sensor 100B includes a pixel array section 110B, a sense circuit section 120B, registers (latches) 152B-0 to 152B-3, a count circuit 153B, a memory 154B, and a selector 155B.

The registers 152B-0 to 152B-3, the count circuit 153B, the memory 154B, and the selector 155B constitute a decision result IC section 150B.

In the CMOS image sensor 100B, pixels are laminated on a circuit substrate in such a way that two pixels DPX1, DPX2 share a single sense circuit 121B and the registers (latches) 152B-0 to 152B-3.

Further, four sense circuits 121B share the count circuit 153B and the memory 154B via the selector 155B.

Count data corresponding to the individual pixels are stored in the memory 154B at different addresses respectively.

FIG. 17 is a diagram illustrating the flow of an imaged data process at high illuminance in the circuit in FIG. 16.

The process is carried out as follows in a unit cycle of 1 microsecond.

First, storage of a charge into the pixel DPX1 starts at time T0, and after 600 nanoseconds, the sense circuit 121B starts reading of the pixel to perform binary decision.

At the end of the unit cycle, the decision data is stored in the latches 152B-0 to 152B-3.

In the next cycle starting at time T1, storage of a charge into the pixel DPX1 starts again, and counting of the data stored in the latches 152B-0 to 152B-3 starts.

Since the count circuit 153B is shared by four columns, latched data in pixels of the individual columns is sequentially sent to the count circuit 153B via the selector 155B to be counted column by column.

In the count process for the pixel DPX1, first, corresponding count data from the memory 154B is set in the count circuit 153B, and the count value is counted up if the value latched in the latches 152B-0 to 152B-3 are "1", but is not updated if the latched values in the latches 152B-0 to 152B-3 are "0".

Thereafter, data in the count circuit 153B is written back at the original address in the memory 154B, which completes the count process for the pixel DPX1.

Alternatively, the above operation may be executed only when data latched in the latches 152B-0 to 152B-3 is "1", and no operations may be executed when the latched data is "0".

Meanwhile, at the same timing of time T1, the sense circuit 121B starts reading data stored in the pixel DPX2.

As the process flow is repeated this way, the sense circuit 121B, the latches 152B-0 to 152B-3, the count circuit 153B and the memory 154B process, in pipeline, data from a plurality of pixels which share the components.

Given that one frame period is 1/60 second at this time, it is possible to make more than 16,300 counts equivalent to 14 bits, and data can be acquired with a high S/N ratio.

Figure 18:
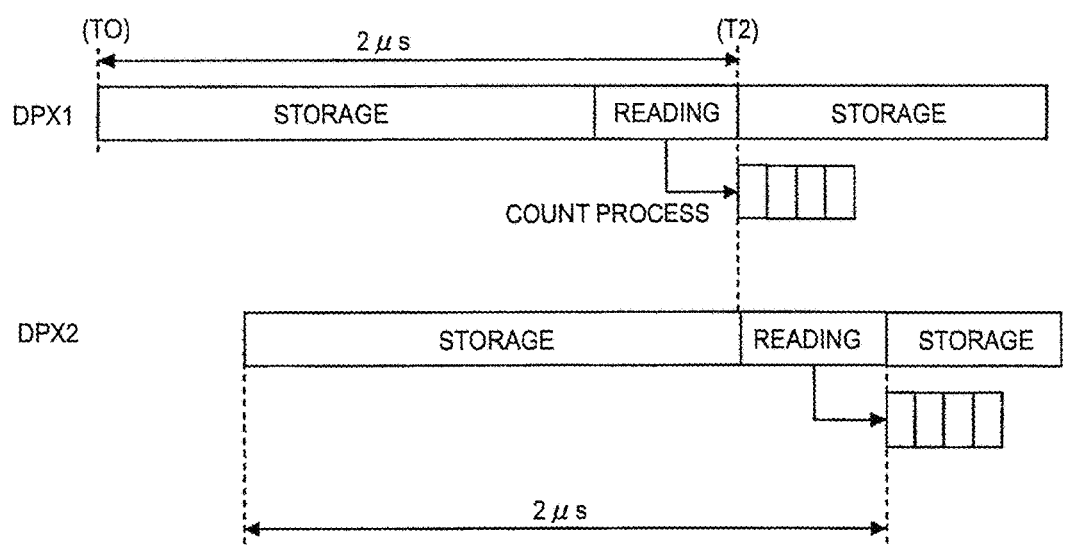
FIG. 18 is a diagram illustrating the flow of an imaged data process at low illuminance in the circuit in FIG. 16.
Figure 19A:
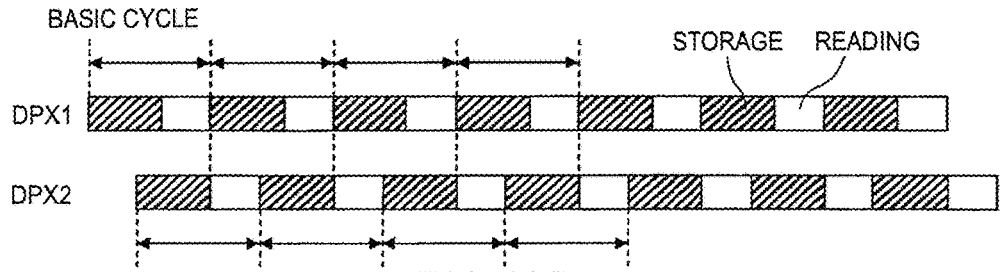
FIGS. 19A to 19D are diagrams showing the concept of cycle switching in the third embodiment.
Figure 19B:
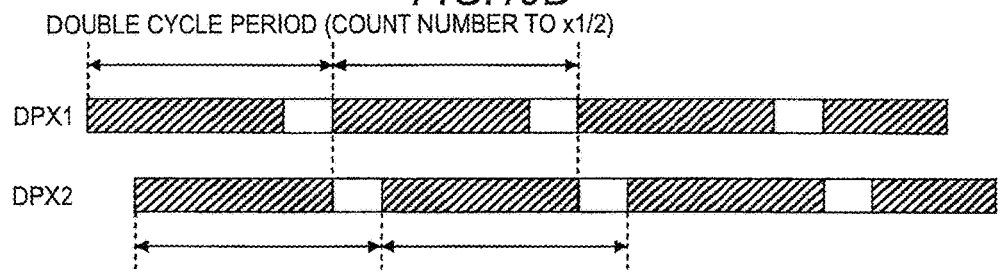
Figure 19C:
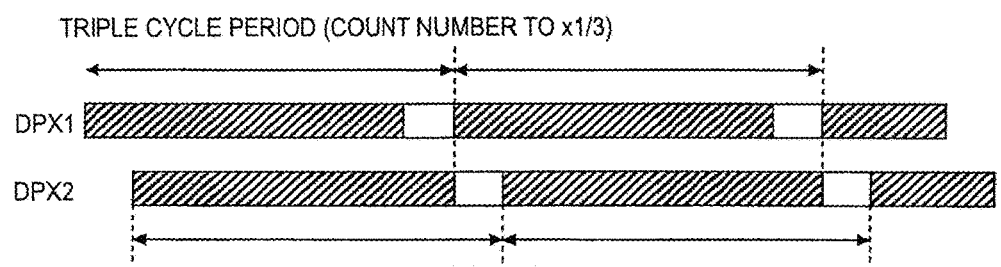
Figure 19D:
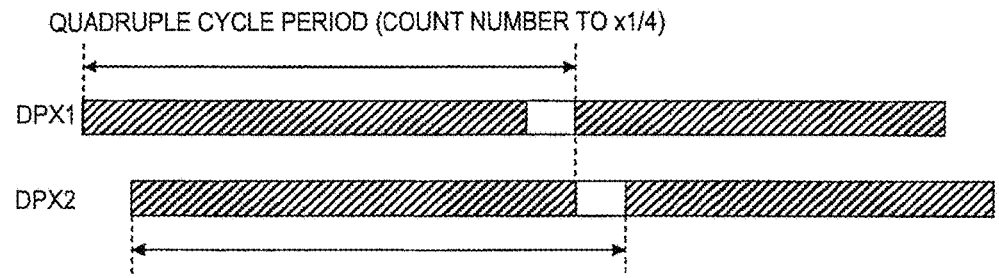

FIG. 18 is a diagram illustrating the flow of an imaged data process at low illuminance in the circuit in FIG. 16.

The read process and the count process are skipped every one cycle from the process shown in FIG. 17, and data storage is maintained during that period. That is, the length of the process cycle for each pixel is doubled to be 2 microseconds.

At this time, the exposure time for each cycle is 1600 nanoseconds at maximum, and an exposure time which is 80 percent of the frame period can be secured.

Given that one frame period is 1/60 second, the number of counts become about a half of the counts in the process in FIG. 2. That is, the number of counts stays becomes over 8,190 equivalent to 13 bits, which is sufficient as the number of counts for low illuminance.

FIGS. 19A to 19D are diagrams showing the concept of cycle switching in the third embodiment.

In FIGS. 19A to 19D, shaded portions indicate storage periods, and transposition portions indicate read periods.

A cycle period N times the basic cycle (where N is an integer) can be set easily by skipping a read process and a count process accompanying the read process from the basic cycle.

The maximum number of counts at this time is approximately 1/N. As the cycle period is elongated as needed at the time of imaging with low illuminance this way, it is possible to significantly reduce power consumption as well as secure the effective exposure period for a long time.

The above cyclic switching and electronic shutter by resetting the pixels may be combined.

That is, although the storage periods in FIGS. 17 and 18 show the maximum storage periods, the substantial storage time can be adjusted finely by resetting the pixels at an arbitrary timing during the storage period.

The combination of the cyclic switching and adjustment of the timing of resetting the pixels can flexibly adjust the storage time, thus ensuring imaging under optimal exposure conditions.

In the actual imaging system, the system decides the brightness of a subject first as generally done in automatic exposure.

Then, high frequency sampling in a short cycle period is employed for imaging with high illuminance, and low frequency sampling in a long cycle period is employed for imaging with low illuminance.

In a simple example, imaging is started in a short cycle period first, and the mode is shifted to a low-illuminance imaging mode when the average number of photons to pixels in a screen in the unit frame period is equal to or less than a given percentage of the total number of counts.

That is, the cycle period is increased along with reduction in the total number of counts. Alternatively, imaging may be started in a long cycle period, and the mode may be shifted to a high-illuminance imaging mode.

Figure 20:
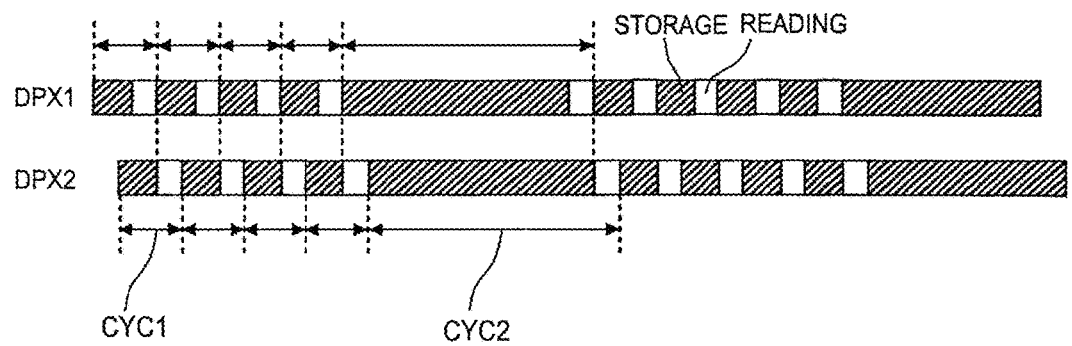
FIG. 20 is a diagram showing an example where the dynamic range of imaging is improved by carrying out counting cyclically with the combination of a long cycle period and a short cycle period.

FIG. 20 is a diagram showing an example where the dynamic range of imaging is improved by carrying out counting cyclically with the combination of a long cycle period and a short cycle period.

In this example, sampling is performed four times in a short cycle CYC1, and sampling is performed once in a cycle CYC2 which is four times longer than the cycle CYC1.

This sampling process is cyclically repeated to perform sampling, for example, 4095 times in the cycle CYC1 and 1023 times in the cycle CYC2 within one frame period. The count values for the individual pixels in each cycle are independently stored in the memory at different addresses.

In sampling in the short cycle CYC1, the number of photons input to each pixel during the total storage period in the sampling can be accurately counted at the time of high illuminance and low illuminance.

In sampling in the long cycle CYC2, on the other hand, the number of input photons is counted substantially accurately at the time of low illuminance, but multiple count misses are included at the time of high illuminance.

The outputs are synthesized, for example, as follows pixel by pixel.

When the count value in the cycle CYC2 is equal to or greater than 256, this pixel is judged to be a high illuminance pixel, and, for example, a value obtained by multiplying the count value in the cycle CYC1 by (total cycle time of CYC1 and CYC2/total storage time of CYC1) is used as the output value of the pixel.

That is, the output is generated only from the count value in the cycle CYC1.

When the count value in the cycle CYC2 is less than 256, on the other hand, this pixel is judged to be a low illuminance pixel.

As the output value of the pixel, for example, a value obtained by multiplying the count value in the cycle CYC2 by (total cycle time of CYC2/total storage time of CYC2) is used as the output value of the pixel is added with a value obtained by multiplying the count value in the cycle CYC2 by (total cycle time of CYC2/total storage time of CYC2). The added value is then output.

That is, the count value in the cycle CYC1 and the count value in the cycle CYC2 are both used.

In this case, power consumption is over 60% of the power consumption in the case of counting the number of photons only in the cycle CYC1, and the number of photons input to a high illuminance pixel can be counted in the short cycle CYC1.

For a low illuminance pixel, a longer actual storage time can be obtained, and the sensitivity can be made higher accordingly.

Even when a high illuminance portion and a low illuminance portion exist in the same screen, therefore, an optimal synthesizing scheme can be selected for each pixel, thus ensuring imaging with less nose and a wide dynamic range.

Further, since sampling in two types of cycles is cyclically carried out multiple times within one frame period, the results are averaged in each cycle, and color shifting or the like originating from a difference in the sample period from one pixel to another does not occur even in imaging a moving subject.

In case where high sensitivity with low illuminance is preferred, for example, the number of samplings in the cycle CYC2 may be increased, and the number of samplings in the cycle CYC1 may be decreased accordingly. In this case, the actual storage time becomes longer.

If the actual storage time is sufficiently long, the output from a low illuminance pixel may be generated only from the count value in the cycle CYC2. At this time, the output from a high illuminance pixel is generated only from the count value in the cycle CYC1.

In addition, imaging may be carried out with three or more types of cycles combined. There are various variations in the scheme of synthesizing the output from the count values in different cycle periods.

The solid-state imaging devices according to the foregoing first, second and third embodiments can be applied as an imaging device for a digital camera and a video camera.

<5. Fourth Embodiment>

Figure 21:
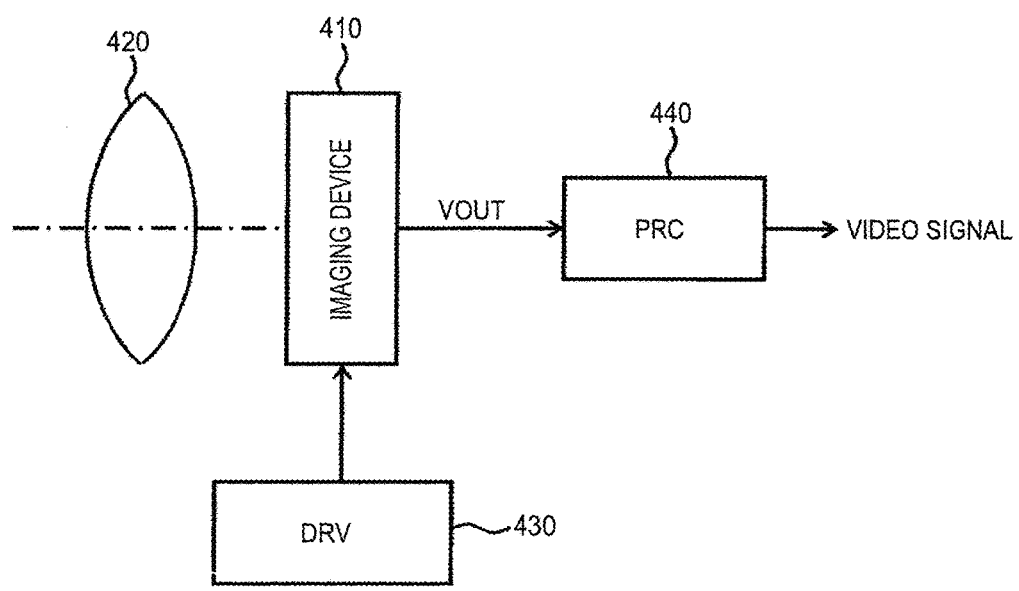
FIG. 21 is a diagram showing one example of the configuration of a camera system to which a solid-state imaging device according to a fourth embodiment of the invention is adapted.

FIG. 21 is a diagram showing one example of the configuration of a camera system to which a solid-state imaging device according to a fourth embodiment of the invention is adapted.

As shown in FIG. 21, a camera system 400 has an imaging device 410 to which the CMOS image sensor (solid-state imaging device) 100, 100A according to the embodiment is adaptable.

The camera system 400 includes an optical system for guiding input light to the pixel region of the imaging device 410 (forms the image of a subject), for example, a lens 420 for forming the image of input light (imaging light) on the imaging surface.

The camera system 400 further includes a drive circuit (DRV) 430 which drives the imaging device 410, and a signal processing circuit (PRC) 440 which processes the output signal of the imaging device 410.

The drive circuit 430 has a timing generator (not shown) to generate various timing signals including a start pulse and a clock pulse to drive internal circuits of the imaging device 410, and drives the imaging device 410 in response to a predetermined timing signal.

The signal processing circuit 440 performs predetermined signal processing on the output signal of the imaging device 410.

The image signal processed by the signal processing circuit 440 is recorded on a recording medium, such as a memory. The image information recorded on the recording medium is hard-copied by a printer or the like. The image signal processed by the signal processing circuit 440 is displayed as a dynamic image on a monitor formed by a liquid crystal display or the like.

As described above, the installation of the foregoing solid-state imaging device 100, 100A as the imaging device 410 in the imaging device for a digital camera or the like can realize a camera with low power consumption and high precision.

It should be understood by those skilled in the art that various modifications, combinations, sub-combinations and alterations may occur depending on design requirements and other factors insofar as they are within the scope of the appended claims or the equivalents thereof.

What is claimed is:

1. A light detecting device comprising:
a first substrate including a plurality of avalanche photodiodes arranged in an array including columns and rows, the plurality of avalanche photodiodes including:
a first group of the plurality of avalanche photodiodes coupled to a first signal line arranged in an i-th column of the array, and
a second group of the plurality of avalanche photodiodes coupled to a second signal line arranged in an (i+1)-th column of the array; and
a second substrate bonded to the first substrate, the second substrate including:
an inverter configured to invert a signal based on at least one of a plurality of outputs from the plurality of avalanche photodiodes, and
a counter coupled to the first and second signal lines.

2. The light detecting device according to claim 1, wherein the counter is configured to count based on at least a first output from the first signal line and a second output from the second signal line.

3. The light detecting device according to claim 1, wherein the substrate includes a first metal pad and a second metal pad electrically connected to the first metal pad.

4. The light detecting device according to claim 3, further comprising an insulating film, wherein a first portion of the first insulating film is attached to the first metal pad.

5. The light detecting device according to claim 4, wherein a second portion of the insulating film is attached to the second metal pad.

6. The light detecting device according to claim 3, wherein the first substrate includes a first via, and a respective avalanche photodiode of the plurality of avalanche photodiodes is coupled to the first metal pad via the first via.

7. The light detecting device according to claim 6, wherein the second substrate includes a second via, and the second via is coupled to the second metal pad.

8. The light detecting device according to claim 1, further comprising a microlens formed on a light receiving surface of the first substrate.

9. The light detecting device according to claim 1, further comprising a color filter formed on a light receiving surface of the first substrate.

10. A light detecting device comprising:
   a first substrate including a plurality of avalanche photodiodes arranged in an array including columns and rows, the plurality of avalanche photodiodes including:
      a first group of the plurality of avalanche photodiodes coupled to a first signal line arranged in an i-th column of the array, and
      a second group of the plurality of avalanche photodiodes coupled to a second signal line arranged in an (i+1)-th column of the array; and
   a second substrate bonded to the first substrate, the second substrate including:
      a multiplex circuit including an input terminal coupled to the first signal line and the second signal line, and
      a counter coupled to an output terminal of the multiplex circuit.

11. The light detecting device according to claim 10, wherein the counter is configured to count based on at least a first output from the first signal line and a second output from the second signal line.

12. The light detecting device according to claim 10, wherein the substrate includes a first metal pad and a second metal pad electrically connected to the first metal pad.

13. The light detecting device according to claim 12, further comprising an insulating film, wherein a first portion of the first insulating film is attached to the first metal pad.

14. The light detecting device according to claim 13, wherein a second portion of the insulating film is attached to the second metal pad.

15. The light detecting device according to claim 12, wherein the first substrate includes a first via, and a respective avalanche photodiode of the plurality of avalanche photodiodes is coupled to the first metal pad via the first via.

16. The light detecting device according to claim 15, wherein the second substrate includes a second via, and the second via is coupled to the second metal pad.

17. The light detecting device according to claim 10, further comprising a register circuit, wherein the first and second signal lines are coupled to the input terminal of the multiplex circuit through the register circuit.

18. The light detecting device according to claim 17, wherein the second substrate includes the register circuit.

19. The light detecting device according to claim 10, wherein the multiplex circuit is configured to output a signal to the counter based on at least one of an output of the first signal line or an output of the second signal line.

20. The light detecting device according to claim 10, further comprising a microlens formed on a light receiving surface of the first substrate.

\* \* \* \* \*